(12) United States Patent
Ichiriu et al.

(10) Patent No.: US 6,901,000 B1
(45) Date of Patent: May 31, 2005

(54) CONTENT ADDRESSABLE MEMORY WITH MULTI-PORTED COMPARE AND WORD LENGTH SELECTION

(76) Inventors: Michael E. Ichiriu, 834 Rubis Dr., Sunnyvale, CA (US) 94087; Varadarajan Srinivasan, 27835 Lupine Rd., Los Altos Hills, CA (US) 94022

( * ) Notice: Subject to any disclaimer, the term of this patent is extended or adjusted under 35 U.S.C. 154(b) by 0 days.

(21) Appl. No.: 10/622,862

(22) Filed: Jul. 18, 2003

Related U.S. Application Data

(63) Continuation-in-part of application No. 10/448,820, filed on May 30, 2003.

(51) Int. Cl.[7] .............................................. G11C 15/00
(52) U.S. Cl. ..................................... 365/49; 365/189.07
(58) Field of Search .............................. 365/49, 189.07

(56) References Cited

U.S. PATENT DOCUMENTS

| | | |
|---|---|---|
| 3,531,778 A | 9/1970 | Gardner et al. |
| 3,543,296 A | 11/1970 | Gardner et al. |
| 3,609,702 A | 9/1971 | Gardner et al. |
| 3,644,906 A | 2/1972 | Weinberger |
| 3,681,762 A | 8/1972 | Minshull et al. |
| 3,706,977 A | 12/1972 | Dailey et al. |
| 3,708,788 A | 1/1973 | Dailey et al. |
| 3,761,902 A | 9/1973 | Weinberger |
| 3,771,142 A | 11/1973 | Minshull et al. |
| 3,890,603 A | 6/1975 | Jones et al. |
| 3,924,243 A | 12/1975 | Vermeulen |
| 4,942,556 A | 7/1990 | Sasaki et al. |
| 5,319,590 A | 6/1994 | Montoye |
| 5,841,874 A | 11/1998 | Kempke et al. |
| 6,044,005 A | 3/2000 | Gibson et al. |
| 6,137,707 A | 10/2000 | Srinivasan et al. |
| 6,154,384 A | 11/2000 | Nataraj et al. |
| 6,310,880 B1 | 10/2001 | Waller |
| 6,373,739 B1 | 4/2002 | Lien |
| 6,597,594 B2 | 7/2003 | Waller |
| 6,760,242 B1 * | 7/2004 | Park et al. ..................... 365/49 |

FOREIGN PATENT DOCUMENTS

| | | |
|---|---|---|
| GB | 1127270 | 9/1968 |
| GB | 1281387 | 7/1972 |

OTHER PUBLICATIONS

Flinders, M. et al., "Functional Memory as a General Purpose Systems Technology," IBM UK Laboratories Ltd., IEEE Compcon, pp. 314–324, Jun. 1970.

Gardner, P. L., "Functional Memory and Its Microprogramming Implications," IEEE Trans. on Computers, vol. C–20, No. 7, pp. 764–775, Jul. 1971.

Kohonen, T., "Content–Addressable Memories," Springer–Verlag Berlin Heidelberg, pp. 173–178, 1980.

* cited by examiner

Primary Examiner—Huan Hoang
(74) Attorney, Agent, or Firm—Shemwell Gregory & Courtney LLP

(57) ABSTRACT

A content addressable memory device having an array of multi-compare CAM cells. First and second compare operations are simultaneously performed in the array of multi-compare CAM cells to generate first and second sets of match signals. The first set of match signals is logically combined with the second set of match signals to generate a set of resultant match signals.

44 Claims, 13 Drawing Sheets

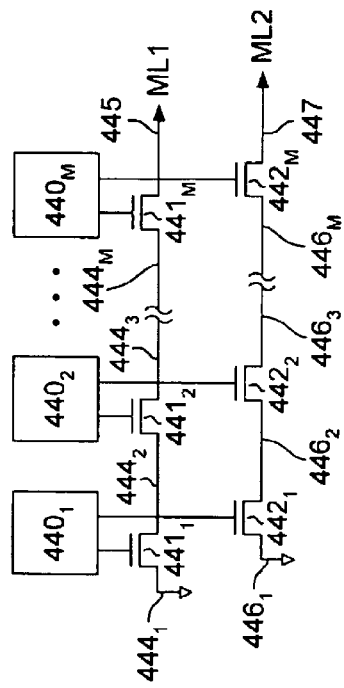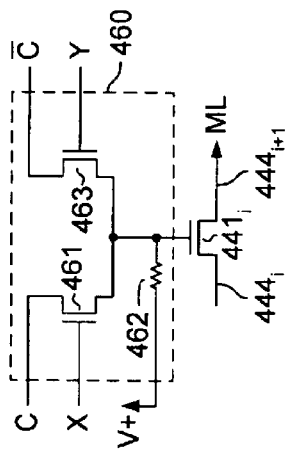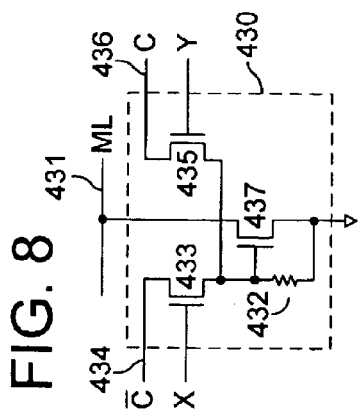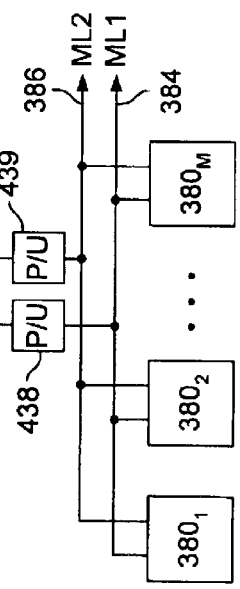

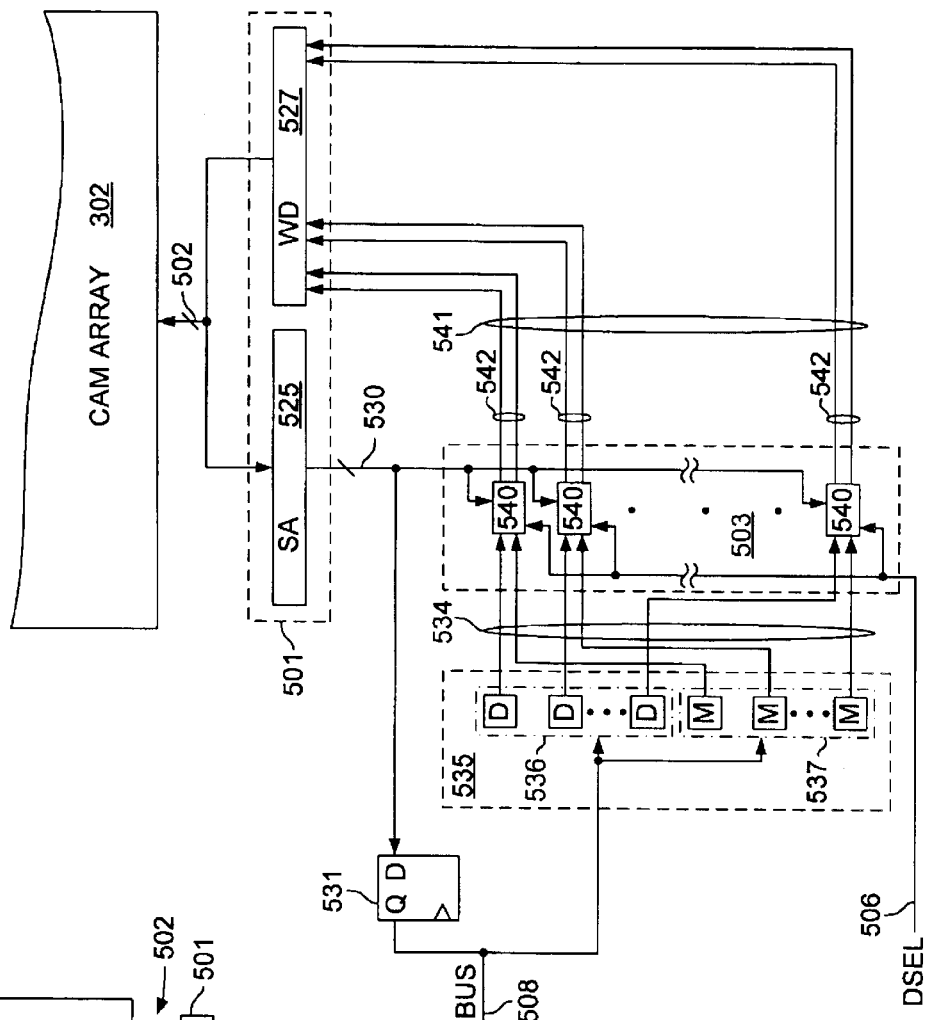
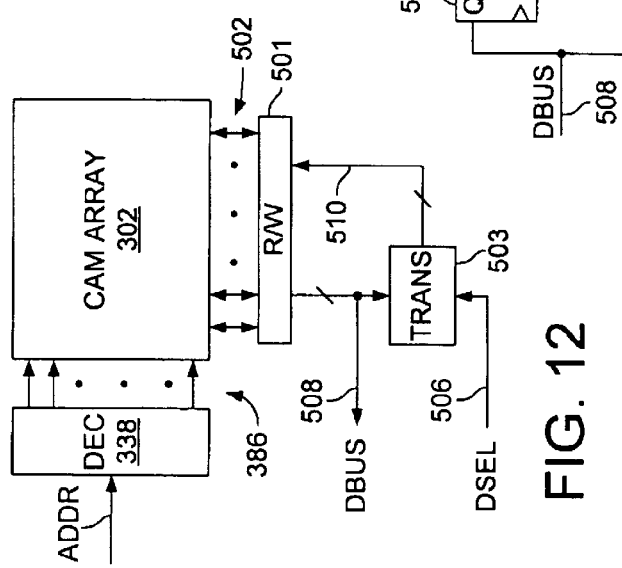

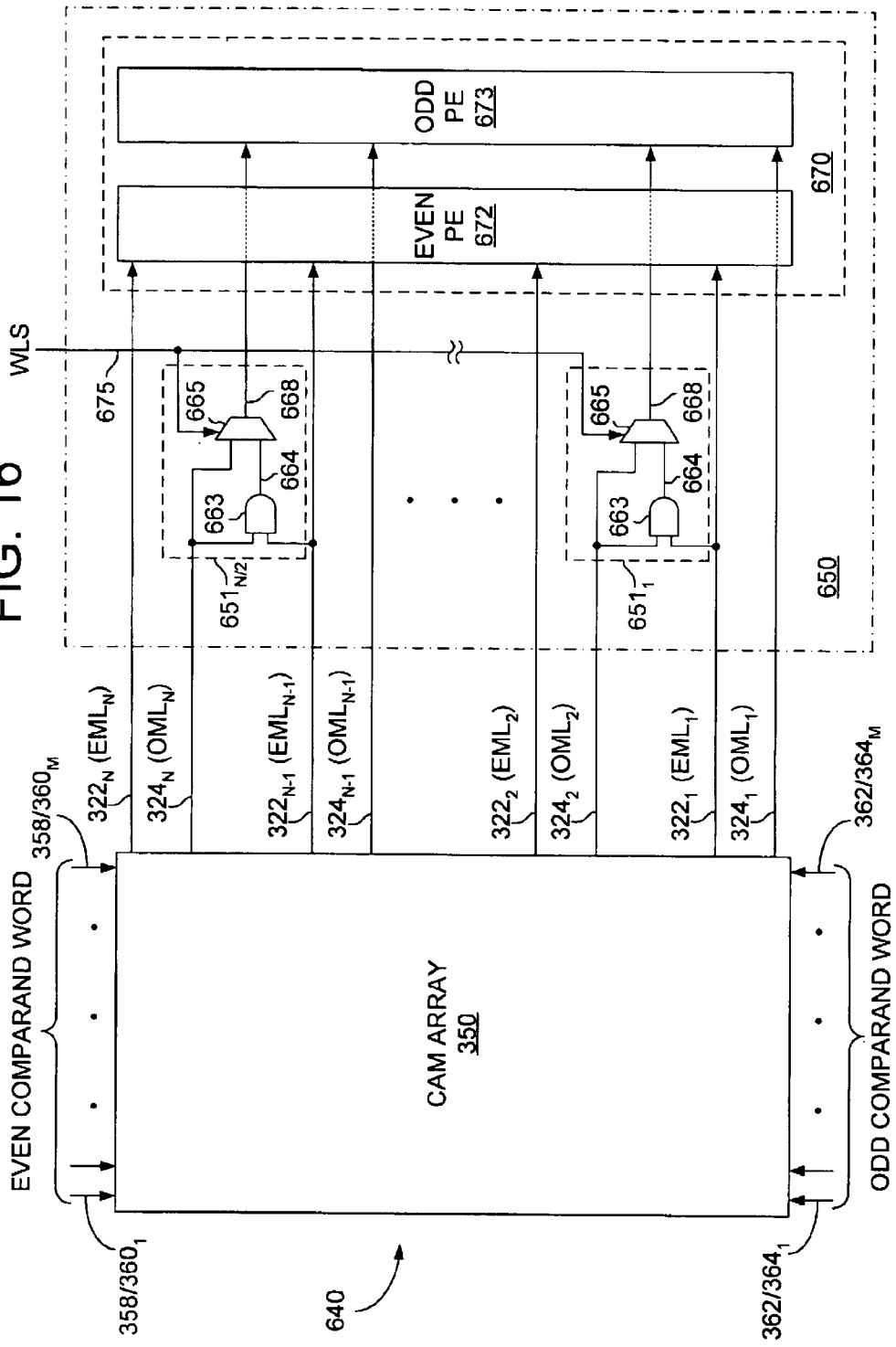

CONTENT ADDRESSABLE MEMORY WITH MULTI-PORTED COMPARE AND WORD LENGTH SELECTION

CROSS-REFERENCE TO RELATED APPLICATIONS

This application is a continuation-in-part of U.S. patent application Ser. No. 10/448,820, filed May 30, 2003. U.S. patent application Ser. No. 10/448,820 is hereby incorporated by reference by in its entirety.

FIELD OF THE INVENTION

The present invention relates generally to content addressable memory (CAM) devices, and more particularly to a method and apparatus for simultaneously performing a plurality of compare operations in a CAM device.

BACKGROUND

A content addressable memory (CAM) device is a storage device that can be instructed to compare a specific pattern of comparand data with data stored in its associative CAM array. The entire CAM array, or segments thereof, are searched in parallel for a match with the comparand data. The CAM device typically indicates if a match occurs by asserting a match flag, and also typically indicates if multiple matches occur by asserting a multiple match flag. The CAM device can then be instructed to output the highest priority match address or index, data stored in one or more CAM cells at the matching address, and other status information including the match flags, a full flag, validity bits (e.g., skip and empty bits), and other status information.

CAM devices require a particular amount of time to perform a compare operation. This time includes the time to load and decode the compare instruction, the time to provide the comparand data to the CAM array, the time to perform the comparison operation within the CAM array, and the time to determine the highest priority matching location. Compare operations have a direct correlation to search rates for the CAM device. It is generally desirable to increase the search rate of a CAM device so to increase the overall throughput of a system incorporating the CAM device.

Pipelining compare instructions to a particular CAM device has been used to increase the throughput of that CAM device. By pipelining compare instructions, the CAM device can run at its maximum sustained search rate over multiple periods of time. For example, if a CAM device can run at 40 MHz and perform one search per clock cycle (i.e., 40 MS/s or 40 million searches per second), then pipelining of the compare instruction will enable the CAM device to further increase the search rate at the expense of an initial cycle latency.

FIGS. 1 and 2 show another technique for increasing the search rate of a CAM device. In FIG. 1, a single CAM device has been replaced with a CAM system 100 that includes multiple CAM devices 107–110 that can increase the sustained search rate of CAM system 100 to approximately four times over that of a single CAM device (e.g., CAM device 107). For example, as shown in FIG. 2, if CAM device 107 has an individual maximum sustained search rate of 40 MS/s, then system 100 can increase the sustained search rate of system 100 to 160 MS/s. This is accomplished at the expense of adding three redundant CAM devices 108–110 each storing a redundant set of data, and by providing separate comparand data to each CAM device in successive clock cycles. As shown in FIG. 2, CAM device 107 will receive a first compare instruction (CMP1) and first comparand data during a first system clock cycle, CAM device 108 will receive a second compare instruction (CMP2) and second comparand data during a second system clock cycle, CAM device 109 will receive a third compare instruction (CMP3) and third comparand data during a third system clock cycle, and CAM device 10 will receive a fourth compare instruction (CMP4) and fourth comparand data during a fourth system clock cycle. While the system clock runs at 160 MHz, each individual CAM device runs at 40 MHz and typically receives a 40 MHz clock signal in addition to the 160 MHz system clock (or a logical combination of the two clocks).

As each CAM device has an individual search rate of 40 MS/s, each CAM device will output to OBUS 104 the matching address of any matching location in its CAM array approximately five cycles after receiving its compare instruction and comparand data. Thus, after an initial lag period of approximately 25 ns, the sustained search rate will be approximately 160 MS/s starting at cycle $T_4$. This increased sustained search rate, however, is achieved at the expense of adding three redundant CAM device 108–110 and control logic (not shown) necessary to ensure that each CAM device is selected in at the appropriate time to receive the instruction and comparand data. The redundant CAM devices each store a duplicate of the data stored in CAM device 107 which results in increased table management by control logic in which system 100 is incorporated.

It would be advantageous to increase the sustained search rate of a CAM device significantly increasing the table management tasks of a system, and without adding additional redundant CAM devices.

BRIEF DESCRIPTION OF THE DRAWINGS

The features and advantages of the present invention are illustrated by way of example and are by no means intended to limit the scope of the present invention to the particular embodiments shown, and in which:

FIG. 7 illustrates an encoding of data and mask bits (D and M) into constituent X and Y bits of a quaternary data value that may be stored in the CAM cell of FIG. 6;

FIG. 8 illustrates an embodiment of a compare circuit that may be used in place of one or both of the compare circuits within the CAM cell of FIG. 6;

FIG. 9 illustrates a row of multi-compare CAM cells coupled to a pair of match lines according to one embodiment;

FIG. 10 illustrates a row of multi-compare CAM cells coupled to a pair of match lines according to another embodiment;

FIG. 11 illustrates a compare circuit that may be used to implement each of the compare circuits within the CAM cells of FIG. 10 in one embodiment;

FIG. 12 illustrates an embodiment of a circuit for reading and writing data in an array of multi-compare, quaternary CAM cells;

FIG. 13 illustrates a more detailed embodiment of the circuit arrangement of FIG. 12;

FIG. 16 illustrates a CAM device having a double-word compare function according to an embodiment of the invention;

DETAILED DESCRIPTION

Figure 1:
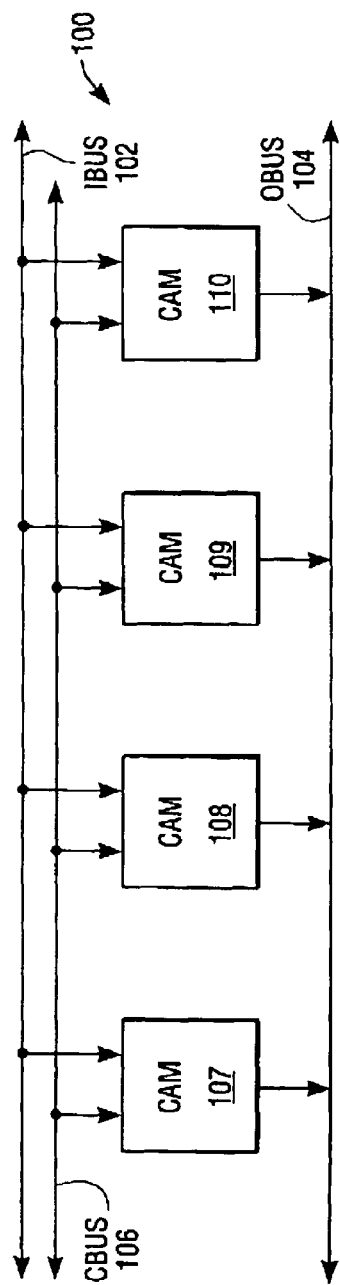
FIG. 1 is a block diagram of a prior CAM system having a plurality of CAM devices each storing the same table.
Figure 2:
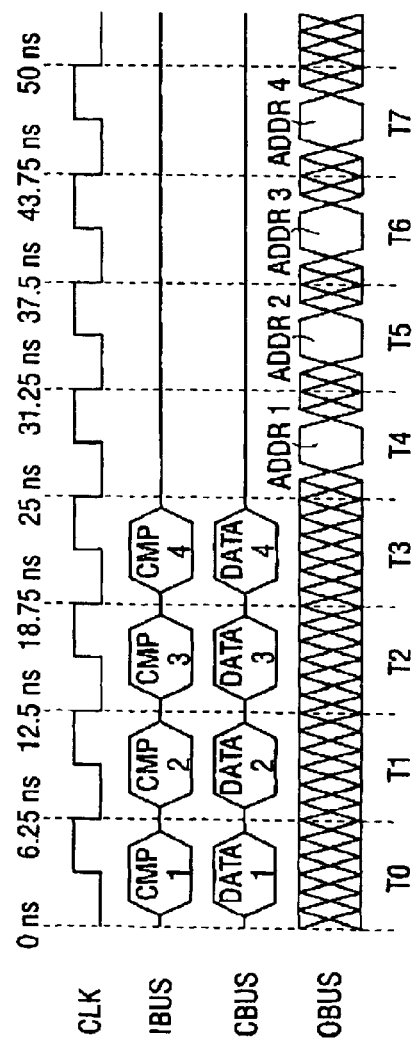
FIG. 2 is timing diagram illustrating the operation of the system of FIG. 1.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single-conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g.,'<signal name>') is also used to indicate an active low signal.

A method and apparatus for simultaneously performing a plurality of compare operations in a content addressable memory (CAM) device is disclosed in various embodiments. In one embodiment, the CAM device includes multiple comparand registers and an array of multi-compare CAM cells. Each of the multi-compare CAM cells includes multiple compare circuits coupled to receive respective comparand data from the multiple comparand registers. In one embodiment, the multiple compare circuits within each of the multi-compare CAM cells are simultaneously enabled to compare respective comparand data with a data value stored within the CAM cell and thereby simultaneously generate multiple comparison results. In an alternative embodiment, the multiple compare circuits are enabled to perform compare operations one after another in pipelined fashion to increase the search rate of the CAM device. In both the simultaneous-compare and pipelined-compare embodiments, a CAM device according to the present invention advantageously enables a single CAM device to have an increased sustained search rate over conventional single CAM devices. This is accomplished without using redundant CAM devices that can cause significant increases in the cost of a system and in overhead due to table management.

In one embodiment, each of the multi-compare CAM cells is a quaternary CAM cell having a pair of memory cells to enable storage of a two-bit data value, referred to herein as quaternary data, representative of one of four logic states for the CAM cell: logic '0', logic '1', forced-match (also referred to as a "don't care" state), and forced-mismatch. One or more of the four logic states may be unused in selected embodiments. By providing quaternary data to each of the multiple compare circuits of a multi-compare CAM cell instead of complementary binary data, comparison results may be masked within each CAM cell (i.e., local masking) without requiring additional transistors or other components in the multiple compare circuits or elsewhere in the CAM cell. Consequently, the quaternary, multi-compare CAM cell may be smaller than a multi-compare CAM cell that includes additional circuit components to achieve local masking. Such size reduction is multiplied by the thousands or millions (or more) of CAM cells included within a given CAM device, substantially reducing the die size of the overall CAM device. The reduced die size potentially enables more of the CAM devices to be fabricated on a given semiconductor wafer, reducing the per-device fabrication cost.

Overview of CAM Device Having Multi-Compare Function

Figure 3:
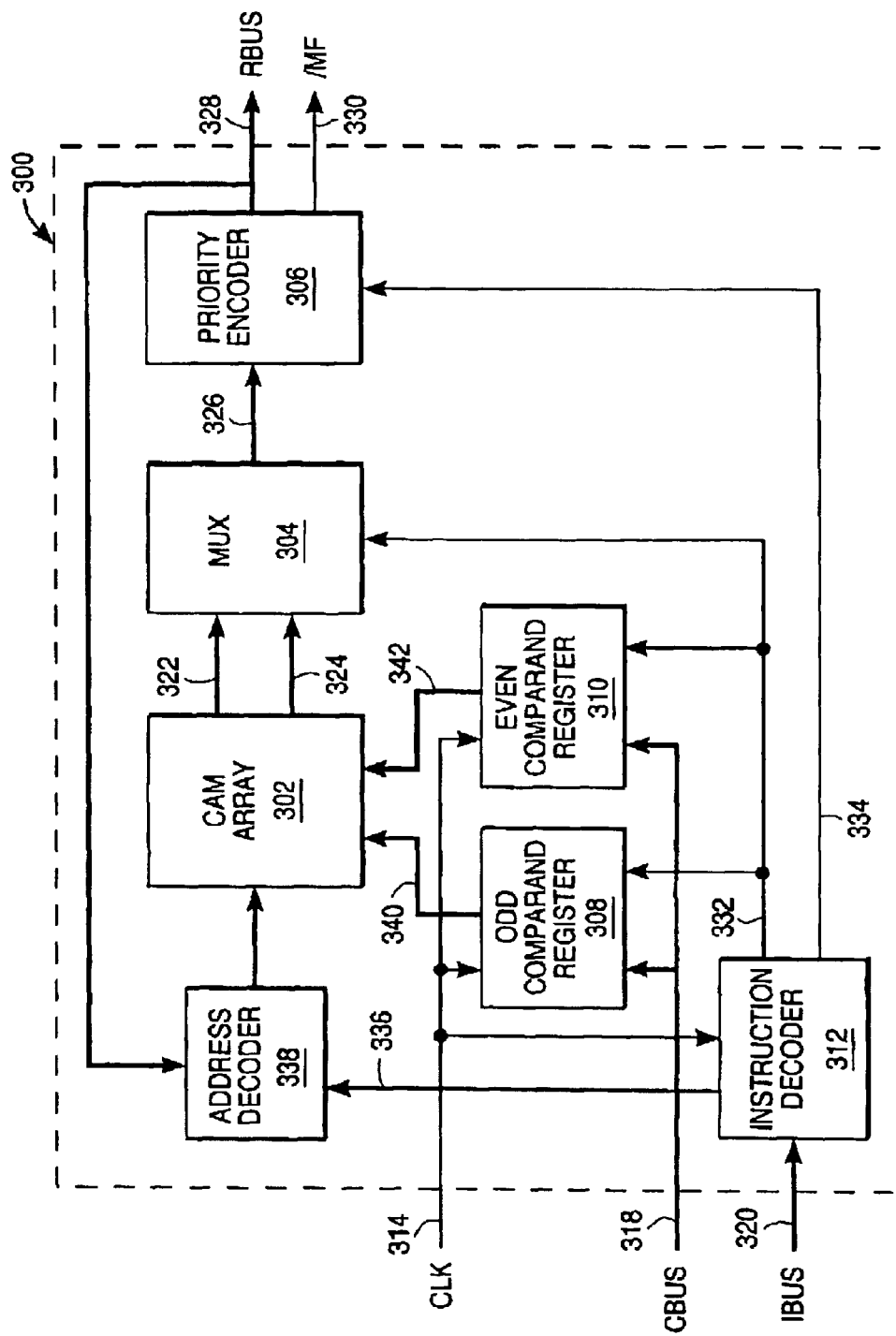
FIG. 3 is a block diagram of one embodiment of a CAM device for simultaneously performing multiple compare operations.

FIG. 3 shows a CAM device 100 that is one embodiment of a CAM device that can perform simultaneous compare operations. CAM device 300 may be a stand-alone CAM device, or may be a CAM device that is incorporated into a larger integrated circuit. CAM device 300 is a synchronous CAM device that performs its operations in response to an external clock signal CLK on line 314. It will be appreciated, however, that alternative embodiments of the present invention may be implemented in asynchronous CAM devices.

CAM device 300 includes an instruction bus IBUS 320 for receiving instructions, a separate comparand bus CBUS 318 for receiving comparand data to be compared with one or more CAM cells of CAM array 302, and a separate output bus RBUS 328 for outputting a matching CAM index or address of CAM array 302. For an alternative embodiment, one or more of buses 318, 320, and 328 may be shared or time multiplexed.

CAM device 300 also includes CAM array 302 that has a plurality of multi-compare CAM cells that store data to be compared with comparand data provided from odd comparand register 308, even comparand register 310, or directly from comparand bus CBUS 318. The comparison results are reflected on even match lines 322 and odd match lines 324 and provided to multiplexer 304. Multiplexer 304 provides either the odd match lines or even match lines to priority encoder 306, and priority encoder 306 outputs a matching address on RBUS 328 and drives match flag /MF on line 330.

Figure 4:
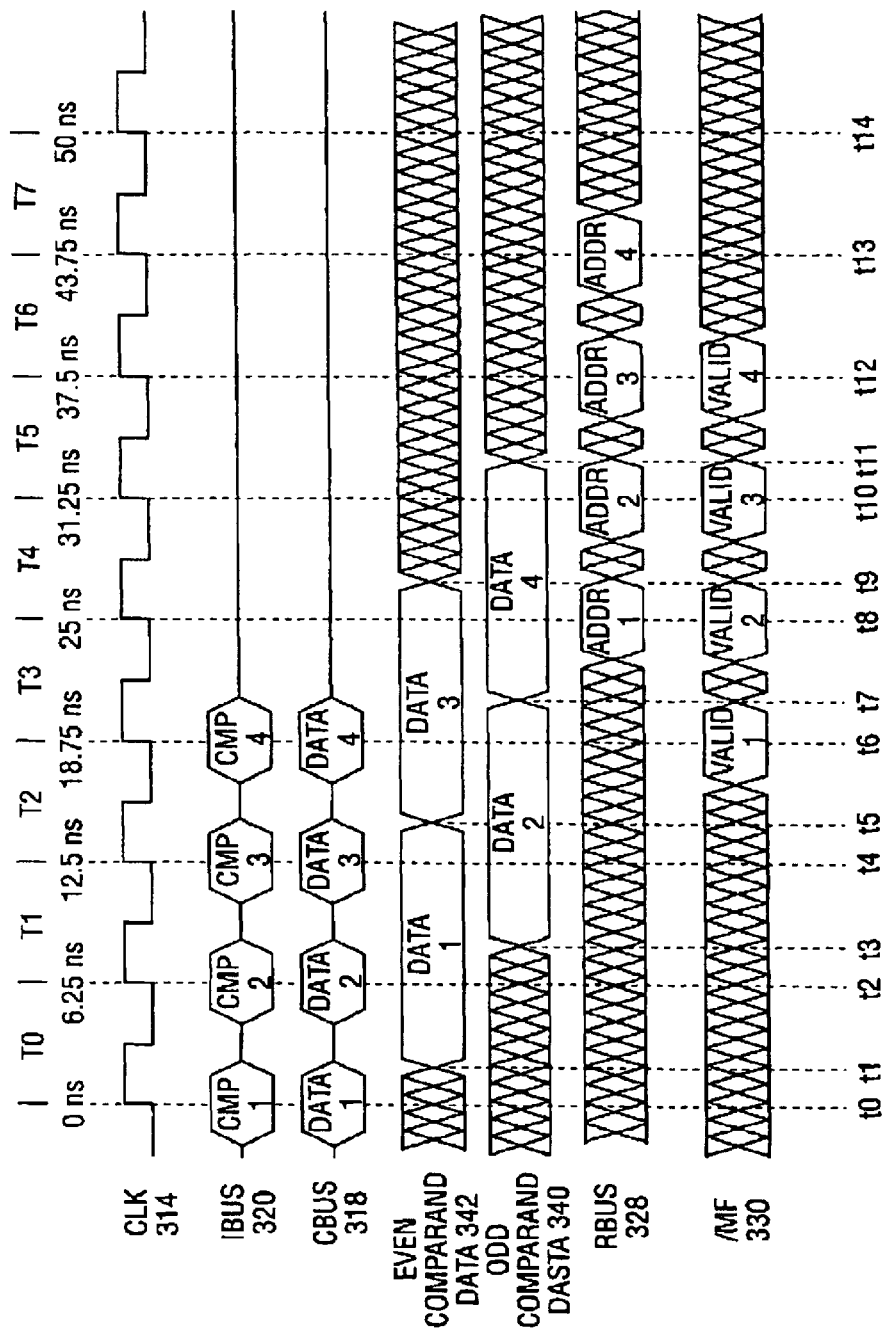
FIG. 4 is a timing diagram illustrating one embodiment of the operation of the CAM device of FIG. 3 simultaneously performing multiple compare operations on the same CAM array.

CAM device 300 can perform multiple interleaved or overlapped compare operations to increase its sustained search rate. For example, as shown in FIG. 4, if CAM device 300 can perform a single compare instruction in approximately 12.5 ns (80 MHz), then CAM device 300 can perform multiple interleaved compare operations to increase the sustained search rate from 80 MS/s to approximately 160 MS/s as follows. At time t0, a first compare instruction (CMP1) is provided to instruction decoder 312 over IBUS 320 together with first comparand data on CBUS 318. Instruction decoder 312 decodes the instruction and causes (e.g., by a signal on line 332) even comparand register 310 to load the first comparand data. Subsequently (e.g., at approximately times t1–t5, even comparand register 310 outputs the first comparand data on bus 342 for comparison with the data stored in CAM array 302. The comparison results are reflected on even match lines 322 and provided to multiplexer 304. Each CAM cell in CAM array 302 is coupled to one of even match lines 322.

At time t2, a second comparison instruction (CMP2) is provided to instruction decoder 312 together with second comparand data on CBUS 318. Instruction decoder 312 decodes the instruction and causes (e.g., by a signal on line 332) odd comparand register 308 to load the second comparand data. Subsequently (e.g., at approximately times t3–t7), odd comparand register 308 outputs the second comparand data on bus 340 for comparison with the data stored in CAM array 302. The comparison results are reflected on odd match lines 324 and provided to multiplexer 304. Each CAM cell in CAM array 302 is coupled to one of odd match lines 324.

As shown in FIG. 4, there is a time (e.g., time t3–t5) in which the first (even) comparand data is provided to CAM array 302 at the same time that the second (odd) comparand data is provided to CAM array 302. During this time, CAM array 302 simultaneously compares the first and second comparand data with its stored data. These comparison results are reflected on even match lines 322 and odd match lines 324.

When the first comparison results are ready, instruction decoder 312 causes multiplexer 304 to select the even match lines to be provided to priority encoder 306 over bus 326. Instruction decoder 312 may do this by sending one or more signals on signal line 332, or by sending one or more signals to logic (not shown) that controls the selection. Priority encoder 306 then determines the highest priority matching location in CAM array that stores data matching the first comparand data, and outputs the address of the highest priority matching location to RBUS 328 by time t8. Alternatively, priority encoder 306 may determine any other priority matching address. For another embodiment, the address of the highest priority matching location may be output to RBUS 328 by time t6. Priority encoder 306 may also determine the state of /MF by time t6 (or by a later time) for the first comparison. Alternatively, separate flag logic may make this determination.

The first match address may optionally be fed back to address decoder 338 to locate the address and read data stored in CAM array at the matching address. This data may be output from CAM device 300 together with the first matching address or at any other predetermined time.

When the second comparison results are ready, instruction decoder 312 causes multiplexer 304 to select the odd match lines to be provided to priority encoder 306 over bus 326. Instruction decoder 312 may do this by sending one or more signals on signal line 332, or by sending one or more signals to logic (not shown) that controls the selection. Priority encoder 306 then determines the highest priority matching location in CAM array that stores data matching the second comparand data, and outputs the address of the highest priority matching location to RBUS 328 by time t10. Alternatively, priority encoder 306 may determine any other priority matching address. For another embodiment, the address of the highest priority matching location may be output to RBUS 328 by time t8 (when the highest priority matching location of the first compare operation is output by time t6). Priority encoder 306 may also determine the state of /MF for the second comparison by time t8 (or by a later time). Alternatively, separate flag logic may make this determination. The match flag results for the second comparison may be output to the same match flag signal line 330, or they may be output to a second independent signal line.

The second match address may also be optionally fed back to address decoder 338 to locate the address and read data stored in CAM array at the matching address. This data may be output from CAM device 300 together with the second matching address or at any other predetermined time.

Similarly, third and fourth compare operations and their corresponding comparand data can be loaded into CAM device 300 as shown in FIG. 4 such that a new compare operation is loaded every clock cycle, and corresponding matching address or index for that operation is output as valid data after two clock cycles (i.e., in cycles T5 and T6, respectively). As shown in FIG. 4, the third compare operation overlaps the second compare operation, and the fourth compare operation overlaps the third compare operation. While there is an initial time lag of approximately 25 ns to obtain the first search results on RBUS 328, CAM device 300 has a sustained search rate of approximately 160 MS/s over cycles T3–T6.

The internal operation of CAM device 300 and the existence of multiple comparand registers may be transparent to the user of CAM device 300. The user simply knows that CAM device 300 can function with a 160 MHz input clock and provide a sustained search rate of approximately 160 MS/s.

For an alternative embodiment of CAM device 300, multiplexer 300 may be omitted and separate priority encoders may be used to resolve the odd and even match lines. The output of each priority encoder may then multiplexed onto RBUS 328, or may be output to separate RBUSes.

CAM device 300 can be extended to include any number of additional comparand registers and additional sets of match lines to accommodate even higher sustained search rates. For example, CAM device 300 can interleave and simultaneously perform three compare operations when a third comparand register is added, CAM array 302 is modified to include a third match line coupled to each CAM cell, and a third plurality of match lines is provided to multiplexer 304.

Additionally, while the example of FIG. 4 shows specific timing, search rates, and frequencies, it will be appreciated that CAM device 300 can be operated with other timings, search rates and/or frequencies in alternative embodiments.

For another embodiment, two separate CBUSes may be used to provide comparand data to comparand registers 308, and 310. In this embodiment, two comparand data can be simultaneously provided to CAM array 302 for simultaneous comparison with data stored in the array. The simultaneous comparison can be performed completely in parallel in time (vs. interleaved), or may be interleaved. The results of the simultaneous comparison can be simultaneously output via the match lines to multiple RBUSes, or can be time-multiplexed on a single RBUS.

CAM Array Having Multi-Compare CAM Cells

Figure 5:
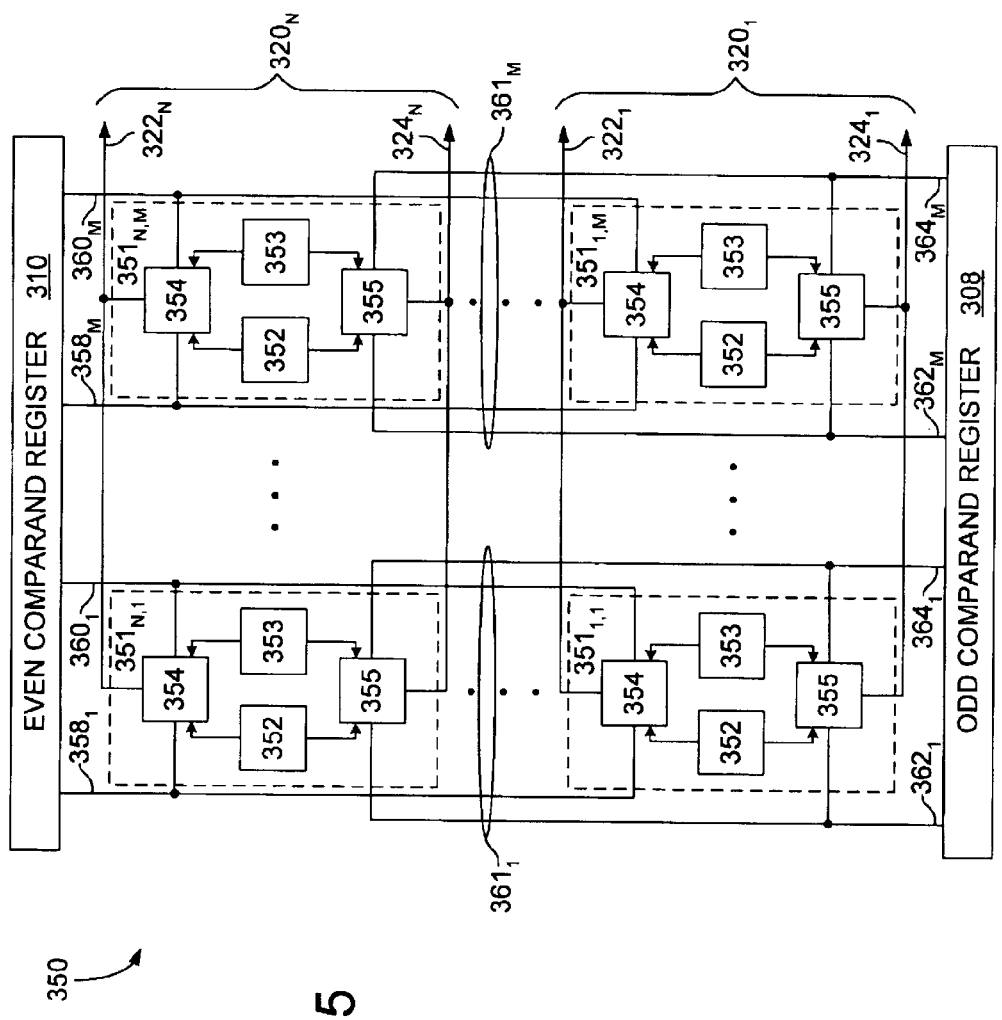
FIG. 5 illustrates one embodiment of a CAM array of the CAM device of FIG. 3.

FIG. 5 illustrates a CAM array 350 that is one embodiment of CAM array 302 of FIG. 3. CAM array 350 includes an array of multi-compare CAM cells 351 arranged in N rows and M columns (N and M being any integer values, including the same value), a set of N match line pairs $320_1$–$320_N$ and a set of M compare line groups $361_1$–$36_M$. The position of each CAM cell 351 within the array 350 is indicated by a row, column subscript. For example, CAM cell $351_{1,1}$ is in the first row of the first column of the CAM array 350. The CAM cells 351 of each row are coupled to a respective match line pair 320, and the CAM cells 351 of each column are coupled to a respective compare line group 361. By this arrangement, each CAM cell 351 within a given column of the CAM array 350 is enabled to receive the same comparand data during a search operation, and each row of CAM cells 351 is enabled to generate a respective pair of match outputs in response to the comparand data Each CAM cell 351 includes two memory cells 352 and 353, and two compare circuits 354 and 355, with each of the compare circuits 354, 355 being coupled to receive a data value from each of the memory cells 352, 353. Also, each of the compare circuits 354, 355 is coupled to a respective one of the match lines 322, 324 that form a match line pair 320, and to a respective one of the compare line pairs 358/360, 362/364 that form compare line group 360. Referring to CAM cell $351_{1,1}$, for example, compare circuit 354 is coupled to receive a first data value from memory cell 352 and a second data value from memory cell 353, and is coupled to even match line 322, (one of the two match lines that form match line pair $320_1$) and to even compare line pair $358_1/360_1$ (one of the two compare-line pairs that form compare line group $361_1$). Similarly, compare circuit 355 is coupled to receive the first and second data values from memory cells 352 and 353, respectively, and is coupled to odd match line 324, (the second of the two match lines that form match line pair $320_1$) and to odd compare line pair $362_1/364_1$ (the second of the two compare-line pairs that form compare line group $361_1$). Through this structure, each CAM cell 351 is enabled to simultaneously compare a quaternary data value stored collectively in memory cells 352 and 353 with respective comparand data delivered via the even and odd compare line pairs 358/360 and 362/364 of a compare line group 361, and to apply the corresponding match results to the even and odd match lines 322 and 324 of a match line pair 320. Word lines and data bit lines for conducting data to and from the memory cells 352 and 353 of each CAM cell 351 are also included within the CAM array 350, but are not shown in FIG. 5 to avoid obscuring the structure of the CAM cells 351 and their interconnections to the compare lines and match lines.

In one embodiment, each of the even compare line pairs 358/360 is coupled to an even comparand register 310 and used to conduct a pair of complementary compare signals representative of a respective constituent bit of an even comparand value (i.e., stored in the register 310) to the corresponding column of CAM cells 351. Similarly, each of the odd compare line pairs 362/364 is coupled to an odd comparand register 308 and used to conduct a pair of complementary compare signals representative of a respective constituent bit of an odd comparand value (i.e., stored in the register 308) to the corresponding column of CAM cells 351. In an alternative embodiment, single-ended compare signals may be delivered to the columns of the CAM cells such that two compare lines may be used to form a given compare line group 361, rather than the four compare lines per group shown in FIG. 5. Also, in a pipelined system, a single comparand register may be used to drive signals onto the even and odd compare line pairs at different times. In yet other embodiments, the comparand registers may be omitted altogether, with the even and odd compare line pairs being driven directly (and either simultaneously or in time-multiplexed fashion) by comparand data signals received via an external interface. Note that, while the compare signals present on a compare line pair are generally referred to herein as being complementary comparand signals, both compare lines of a compare line pair may be driven to the same state (low or high), for example, to mask compare operations within an entire column of the CAM array 350.

Still referring to FIG. 5, the memory cells 352 and 353 may be any type of volatile or non-volatile memory cell including, without limitation, static random access memory (SRAM) cells formed from back-to-back coupled inverters, negative-differential-resistor (NDR) devices, such as thyristor-based random access memory (T-RAM), or other data latching structures; dynamic random access memory cells (DRAM); programmable read-only memory (PROM) cells such as various types of erasable PROM (e.g., electrically erasable PROM (EEPROM) such as flash EEPROM) and so forth.

Because each CAM cell 351 includes two compare circuits 354, 355 coupled respectively to match lines 322 and 324, each CAM cell 351 is capable of simultaneously performing two comparison operations on the data stored in the memory cells 352 and 353. That is, odd compare circuits 354 can compare the data from odd comparand register 308 with the data in memory cells 352 and 353 at the same time that even compare circuits 355 can compare data from even comparand register 310 with the data in memory cells 352, 353, thereby increasing the overall sustained search rate of the CAM array 350. Each of the compare circuits 354, 355 may be any type of compare circuit that can compare the data value stored in memory cells 352 and 353 with the comparand data delivered via the corresponding compare line pair.

Each CAM cell 351 can be extended to perform as many simultaneous compare operations as are required by a CAM device incorporating CAM array 350 by including additional compare circuits, compare lines, and match lines. For example, three simultaneous compare operations can be performed by adding a third match line coupled to a third compare circuit in each CAM cell 351. As with compare circuits 354 and 355, the third compare circuit is coupled to receive data from each of the memory cells 352 and 353, and may be coupled to receive third comparand data from a third comparand register via a third set of compare lines.

Quaternary Multi-Compare CAM Cell

Figure 6:
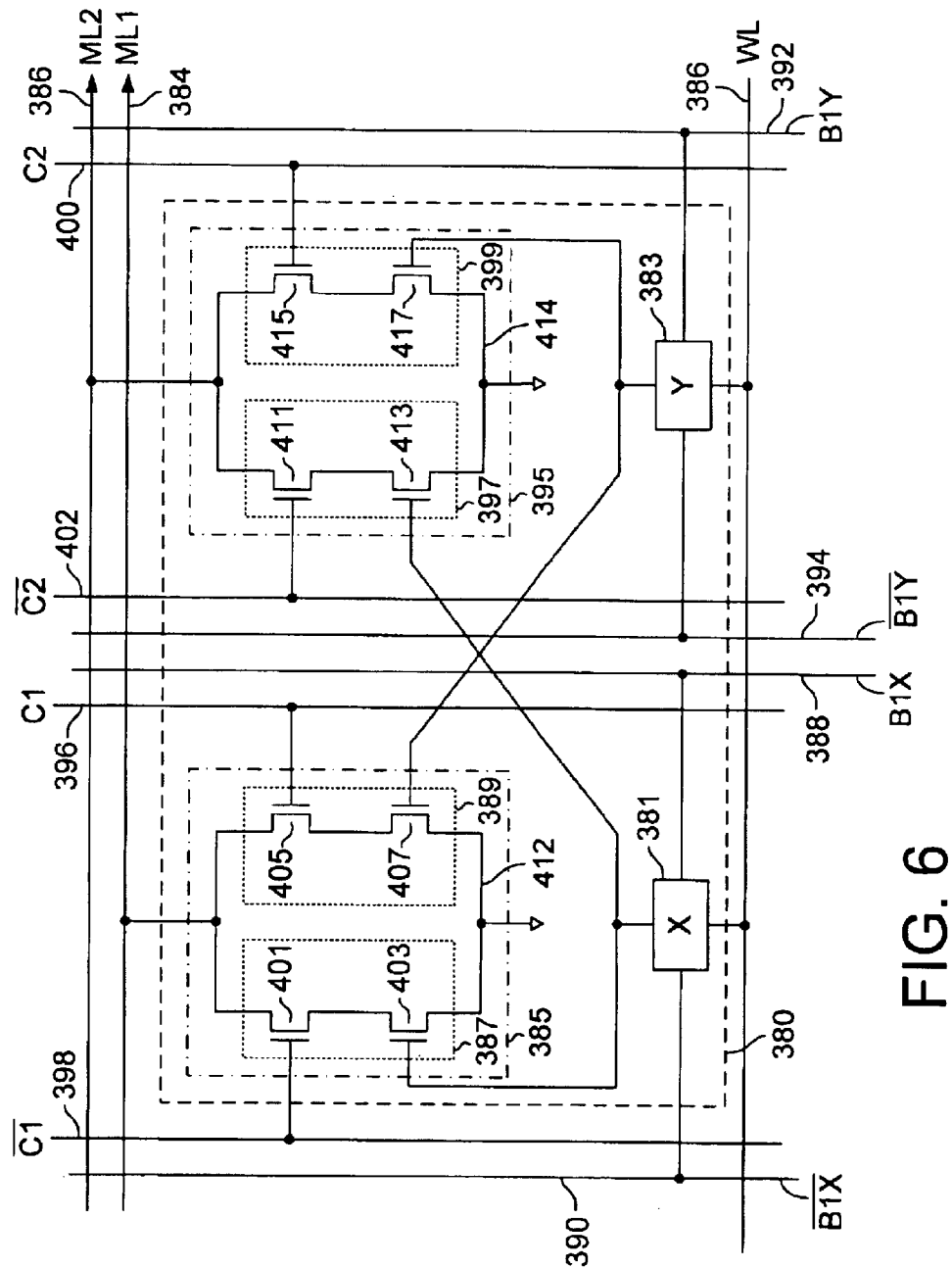
FIG. 6 illustrates one embodiment of a CAM cell of the CAM array of FIG. 5.

FIG. 6 illustrates a multi-compare CAM cell 380 that is one embodiment of the CAM cell 351 of FIG. 5. The CAM cell 380 includes a pair of memory cells 381 and 383 to store the constituent bits, X and Y, respectively, of a quaternary data value, and which are referred to herein as the X-cell 381 and the Y-cell 383. A word line 386 (WL) is coupled to the X-cell 381 and Y-cell 383 and, when activated, enables read/write access to the X- and Y-cells through respective bit line pairs 388/390 and 392/394 (referred to herein as the X-bit lines and Y-bit lines, respectively). A pair of match lines 384 and 386 are coupled to the CAM cell 380 and used to signal the results of compare operations within the CAM cell. In the embodiment of FIG. 6, each of the match lines 384 and 386 is initially precharged to a logic high level (e.g., via precharge or pull-up circuits, not shown), and is then discharged by the CAM cell 380 (i.e., pulled down to a logic low level) to signal a mismatch. If no mismatch is detected by CAM cell 380 (or other CAM cells 380 coupled to the match line), the match line (384 or 386) remains at the logic high level to signal a match. Other match line configurations and match signal states may be used in alternative embodiments, as discussed below.

CAM cell 380 also includes two compare circuits 385 and 395 each coupled to receive the quaternary data value stored in the memory cells 381 and 383, and each coupled to a respective one of match lines 384 (ML1) and 386 (ML2). The compare circuits 385 and 395 are additionally coupled to respective compare line pairs 396/398 and 400/402 to receive respective complementary pairs of comparand signals (i.e., C1 and /C1, and C2 and /C2). By this arrangement, the CAM cell 380 is able to perform simultaneous or pipelined compare operations in the two compare circuits and therefore constitutes a dual-compare CAM cell. Additional compare circuits (coupled to additional match lines and compare line pairs) may be provided in alternative embodiments of the CAM cell 380 to enable more than two simultaneous comparisons or more than two pipelined compare operations.

Still referring to FIG. 6, compare circuit 385 includes a pair of compare sub-circuits 387/389 coupled in parallel with one another between reference node 412 (a ground node in this example, though other reference voltages may be used) and match line 384 (ML I), and compare circuit 395 similarly includes a pair of compare sub-circuits 397/399 coupled in parallel with one another between reference voltage node 414 and match line 386 (ML2). Referring specifically to compare circuit 385, sub-circuit 387 includes transistors 401 and 403 coupled in series between match line 384 and reference node 412, and sub-circuit 389 includes transistors 405 and 407 also coupled in series between match line 384 and reference node 412. In compare circuit 395, sub-circuit 397 includes transistors 411 and 413 coupled in series between match line 386 and reference node 414, and sub-circuit 399 includes transistors 415 and 417 also coupled in series between match line 386 and the reference node 414. Control terminals of transistors 403 and 413 (i.e., MOS transistor gates in this example) are coupled to X-cell 381 and therefore are switched on or off according to the state of the X-bit of a quaternary data value, and control terminals of transistors 407 and 417 are coupled to Y-cell 383 and are therefore switched on or off according to the state of the Y-bit of the quaternary data value. Transistors 405 and 401 are coupled to compare lines 396 and 398, respectively and are therefore switched on or off according to the state of comparand signals C1 and /C1 presented on the compare line pair 396/398. Transistors 415 and 411 are similarly coupled to compare lines 400 and 402, respectively, and are therefore switched on or off according to the state of comparand signals C2 and /C2 presented on the compare line pair 400/402. Thus, match line 384 is switchably coupled to reference node 412 via transistor pair 401/403 of compare sub-circuit circuit 387, and via transistor pair 405/407 of compare sub-circuit 389. Similarly, match line 386 is switchably coupled to reference node 414 via transistor pair 411/413 of compare sub-circuit 399 and via transistor pair 415/417 of compare sub-circuit 399.

FIG. 7 illustrates an encoding of data and mask bits (D and M) into constituent X and Y bits of a quaternary data value that may be stored in the X- and Y-cells 381, 383 of FIG. 6. In traditional ternary CAM devices, data bits and mask bits are stored within each CAM cell. Data bits are compared with incoming comparand data, and mask bits, when set to a mask state, are used to prevent mismatch conditions (i.e., mismatch between data bit and comparand signal) from being signaled on a match line. In the encoding of FIG. 7, when the mask bit, M, is a logic '0' (i.e., a non-masking state), the X bit has the same state as the data bit, D, and the Y bit is the complement of the X bit. That is, if M=0, then X=D and Y=/X=/D. By contrast, if the mask bit is a logic '1', indicating that any mismatch detected within the CAM cell is to be masked, then both the X and Y bits are set to zero, regardless of the state of the data bit. For the encoding of FIG. 7, the quaternary data value is said to be in a logic '0' state when XY=01 (i.e., X=D=0 and Y=/D=1); a logic '1' state when XY=10 (i.e., X=D=1, Y=/D=0); and a forced-match state when XY=00 (i.e., M=1 and D=0 or 1). This encoding simplifies to the Boolean expressions: X=D*/M and Y=/D*/M, where the '*' symbol denotes a logic AND function. Note that a forced-mismatch state (XY=11) may also be stored in the CAM cell 380 to force a mismatch indication. Forced-mismatch operation and storage of the forced-mismatch state is discussed below.

Referring again to FIG. 6, and to compare circuit 385 in particular, it can be seen that if the quaternary data value stored in the X- and Y-cells is in a logic '0' or logic '1' state (i.e., XY=01 or XY=10), and the comparand value, C1, is in the opposite state, then one or the other of sub-circuits 387 and 389 will establish a path between match line 384 and reference node 412 to signal the mismatch condition. For example, if the quaternary data value is a logic '0' (XY=01) and C1 is a logic '1', then transistor 407 will be switched on (i.e., switched to a current conducting state) by the '1' stored in Y-cell 383, and transistor 405 will be switched on by the high state of C1, thereby establishing a path between match line 384 and reference node 412 to signal the mismatch condition. Conversely, if the quaternary data value is a logic '1' (XY=10), and C1 is a logic '0', then transistor 403 will be switched on by the '1' stored in the X-cell 381, and transistor 401 will be switched on by the high state of /C1, thereby establishing a path between match line 384 and reference node 412 to signal the mismatch condition.

If the quaternary data value has the same state as C1, then at least one transistorin each of the sub-circuits 387 and 389 will be switched off(i.e., switched to a substantially non-conducting state). That is, if the quaternary data value matches the comparand value, neither of the sub-circuits 387 and 389 will establish a path between the match line 384 and reference node 412, in effect, signaling a match condition. Similarly, if the quaternary data value is in the forced-match state (XY=00), both of the sub-circuits 387 and 389 are switched to a non-conducting state (i.e., because transistors 403 and 407 are switched off) regardless of the state of C1, preventing either of the sub-circuits 387 and 389 from establishing a path between the match line 384 and reference node 412 and thereby forcing the compare circuit 385 to signal a match condition. If the quaternary data value is in a forced-mismatch state (XY=11), then at least one of the sub-circuits 387 and 389 is ensured to be switched to a conducting state in response to a differential comparand signal on compare lines 396 and 398, thereby forcing the compare circuit 385 to signal a mismatch condition regardless of the state of C1. As discussed below, the forced-mismatch data state may be used for any number of purposes (e.g., testing the CAM array and match detection logic, selectively invalidating rows of the CAM array, etc.).

In the case of compare circuit 395, if the comparand value, C2, is in the opposite state of the quaternary data value stored in the X- and Y-cells 381, 383, then one or the other of sub-circuits 397 and 399 will establish a path between match line 386 and reference node 414 (ground in this example) to signal the mismatch condition. For example, if the quaternary data value is a logic '0' and C2 is a logic '1', then transistor 417 will be switched on by the '1' stored in Y-cell 383, and transistor 415 will be switched on by the high state of C2, thereby establishing a path between match line 386 and reference node 414 to signal the mismatch condition. Conversely, if the quaternary data value is a logic '1', and C2 is a logic '0', then transistor 413 will be switched on by the '1' stored in the X-cell 381, and transistor 411 will be switched on by the high state of /C2, thereby establishing a path between match line 386 and reference node 414 to signal the mismatch condition.

If the quaternary data value has the same state as C2, then at least one transistor in each of the sub-circuits 397 and 399 will be switched off in response to a logic low input, thereby preventing both of the sub-circuits 397 and 399 from establishing a path between the match line 386 and reference node 414 and, in effect, signaling a match condition. Similarly, if the quaternary data value is in the forced-match state (XY=00), both of the sub-circuits 397 and 399 are switched to a non-conducting state (i.e., because transistors 413 and 417 are switched off) regardless of the state of C2, preventing both of the sub-circuits 397 and 399 from establishing a path between the match line 386 and reference node 414 and thereby forcing the compare circuit 395 to signal a match condition. If the quaternary data value is in a forced-mismatch state (XY=11), then at least one of the sub-circuits 397 and 399 is ensured to be switched to a conducting state in response to a differential comparand signal on compare lines 400 and 402, thereby forcing the compare circuit 395 to signal a mismatch condition regardless of the state of C2.

Reflecting on the CAM cell 380 of FIG. 6, it can be seen that encoding mask and data bits into the X and Y bits of a quaternary data value enables ternary operation of the compare circuits 385 and 395 (i.e., ability to force a match state) without requiring additional transistors or other components within the CAM cell. For example, the additional transistor or transistors typically coupled between match line and compare circuit (or between compare circuit and ground, or between memory cell and compare circuit, or between the comparand and compare circuit) and controlled by a mask cell to provide ternary operation, is omitted in the CAM cell 380, thereby reducing the overall component count for the CAM cell 380 and enabling a correspondingly reduced cell size.

FIG. 8 illustrates an embodiment of a compare circuit 430 that may be used in place of one or both of the compare circuits 385 and 395 within the CAM cell of FIG. 6. The compare circuit 430 includes three transistors 433, 435 and 437, with transistor 437 being coupled between a match line 431 (ML) and a reference voltage (ground in this example) and having a gate terminal coupled to source terminals of transistors 433 and 435. Drain terminals of transistors 433 and 435 are coupled to compare lines 434 and 436, respectively, and gate terminals of transistors 433 and 435 are coupled to receive the X bit and Y bit, respectively, of a quaternary data value. If the quaternary data value, XY, does not match a differential comparand value, C and /C, presented on compare lines 436 and 434, then either X=1 and /C=1, or Y=1 and C=1. In the first mismatch case (X=1, /C=1), transistor 433 is switched on by the high X bit so that the high state of the complement comparand signal, /C, propagates to the gate of transistor 437, switching transistor 437 on and thereby establishing a path between the match line 431 and ground to signal the mismatch. In the second mismatch case (Y=1, C=1), transistor 435 is switched on by the high Y bit so that the high state of the comparand signal, C, propagates to the gate of transistor 437, switching transistor 437 on to signal the mismatch condition. If the quaternary data value does not match the differential comparand value, then a logic low signal is applied to the drain terminal of whichever of transistors 433 and 435 is switched on by the quaternary data value. Consequently, the transistor 437 will not be switched on to establish a path between match line 431 and ground, (i.e., the compare circuit 430 will effectively signal a match condition). Note that, in an alternative embodiment, the data and comparand inputs may be swapped by applying the X and Y bits of the quaternary data value to the drain nodes of the transistors 433 and 435, and applying the complementary comparand signals to the gate nodes of the transistors 433 and 435.

Still referring to FIG. 8, when the quaternary data value is in the forced-match state (XY=00), both transistors 433 and 435 are switched off, isolating the gate of transistor 437. Consequently, transistor 437 will not be switched on and therefore will not establish a path between match line 431 and ground. Thus, when the quaternary data value is in the forced-match state, a match condition is indicated by the compare circuit 430, regardless of the state of the comparand data. Conversely, when the quaternary data value is in the forced-mismatch state (XY=11), both transistors 433 and 435 are switched on, thereby ensuring that transistor 437 will be switched on to establish a path between match line 431 and ground (signaling a mismatch) for any complementary pair of signals on compare lines 434 and 436. Note that a resistive element 432, such as a bleed resistor or similar structure, may be coupled between the gate of transistor 437 and ground to prevent the gate of transistor 437 from floating when transistors 433 and 435 are switched off.

Match Line Arrangements for Rows of Multi-Compare CAM Cells

In one embodiment, illustrated in FIG. 9, match lines 384 and 386 (ML1 and ML2) are each coupled to a row of multi-compare CAM cells $380_1$–$380_M$ and are pulled up to a supply voltage or other reference voltage through respective pull-up circuits 438 and 439. Accordingly, if any one of the ML1-connected compare circuits within the row of CAM cells $380_1$–$380_M$ detects a mismatch or receives a forced-mismatch quaternary data value, the compare circuit will pull match line 384 low to signal the mismatch condition. Similarly, if any one of the ML2-connected compare circuits within the row of CAM cells $380_1$–$380_M$ detects a mismatch or receives a forced-mismatch quaternary data value, the compare circuit will pull match line 386 low to signal the mismatch condition. If no mismatch is signaled by the compare circuits coupled to a given match line 384 or 386 (i.e., either because the comparand data supplied to a given CAM cell matches the quaternary data value stored within the CAM cell 380, or the quaternary data value stored within the CAM cell 380 is set to a forced-match state), then the match line remains pulled up to signal the match condition.

FIG. 10 illustrates a match line arrangement according to an alternative embodiment. Each of the match lines ML1 and ML2 is formed by a respective set of match line segments $444_1$–$444_M$ and $446_1$–$446_M$ coupled to one another via a corresponding set of switching transistors $441_1$–$441_M$ and $442_1$–$442_M$ to form a switchably controlled path between the match line output 445 and 447 and a reference voltage node (ground in this example). Referring to ML1, for example, if all the switching transistors $441_1$–$441_M$ are switched on, a path is completed between the ML1 output 445 and ground to signal a match condition. If one or more of the switching transistors $441_1$–$441_M$ are switched off, the path to ground is interrupted to signal a mismatch condition (e.g., the match line output being pulled up to a reference voltage by a precharge circuit). Similarly, if all the switching transistors $442_1$–$442_M$ of ML2 are switched on, a path is completed between the ML2 output 447 and ground to signal a match condition. If one or more of the switching transistors $442_1$–$442_M$ are switched off, the path to ground is interrupted to signal a mismatch condition. If necessary for the logic circuits receiving the match line outputs 445 and 447 (e.g., multiplexer 304 of FIG. 3 or, if the multiplexer is omitted, one or more priority encoders such as priority encoder 306 of FIG. 3), the match line outputs 445 and 447 may be pulled up via pull-up circuits (not shown).

In the embodiment of FIG. 10, negative-type MOS (NMOS) transistors are used to interconnect match line segments $444_1$–$444_M$ and $446_1$–$446_M$, and the CAM cells $440_1$–$440_M$ each generate logic high outputs to signal a match condition. In one embodiment, the CAM cell 380 of FIG. 6 is modified to achieve this result by complementing the state of the comparand signals driven on compare line pairs 396/398 and 400/402 (e.g., C1 is input to transistor 401, /C1 is input to transistor 405, C2 is input to transistor 411 and /C2 is input to transistor 415), and by coupling the reference voltage nodes 412 and 414 to a supply voltage (or other high logic voltage node) instead of ground. Alternatively, rather than complementing the states of the comparand signals driven on the compare line pairs 396/398 and 400/402, the states of the X and Y bits stored within the memory cells 381 and 383 may be complemented, at least for the logic '1' and logic '0' states (in effect, swapping the X and Y memory cells 381 and 383). In yet another embodiment, positive-type MOS (PMOS) transistors may be used in place of the NMOS transistors 441 and 442 depicted in FIG. 10. In such an embodiment, the PMOS transistors are switched on in response to logic low match indications so that the reference voltage nodes 412 and 414 within the CAM cell 380 of FIG. 6 may remain coupled to ground, and either the comparand signals, or the constituent bits of the quaternary data value may be complemented to generate logic low match indications.

FIG. 11 illustrates a two-transistor compare circuit 460 that may be used to implement each of the multiple compare circuits within each of the CAM cells $440_1$–$440_M$ of FIG. 10. The compare circuit 460 is similar in structure and operation to the compare circuit 430 of FIG. 8, except that the transistor 437 coupled between match line 431 and ground is omitted, in effect, being replaced by a transistor $441_i$ coupled between a pair of match line segments $444_i$ and $444_{i+1}$ ('i' being an integer between 1 and M), and the position of the quaternary data inputs, X and Y, are reversed relative to the complementary comparand signal inputs, C and /C (i.e., X and C are applied to the gate and drain of transistor 461 (or vice-versa) and Y and /C are applied to the gate and drain of transistor 463). Thus, if the quaternary data value matches the comparand value, C, then either C and X will be high or /C and Y will be high, both cases resulting in a logic high signal being applied to the gate of transistor $441_i$ switching transistor $441_i$ on to establish continuity between the match line segments $444_i$ and $444_{i+1}$. A resistive element 462, such as a bleed resistor or similar structure, may be coupled between the output node of the compare circuit 460 (i.e., and therefore to the source terminals of transistors 461 and 463) and a logic high voltage node (V+) to pull up the gate of transistor $441_i$ when transistors 461 and 463 are switched off, thereby maintaining transistor $441_i$ in a conducting state to signal a match. In an alternative embodiment, a pair of PMOS transistors are coupled in series between the gate of transistor $441_i$ and a logic high voltage node, the PMOS transistors being switched on in response to logic low X and Y inputs, respectively, to establish a path between the logic high voltage node and the gate of transistor $441_i$ when transistors 461 and 463 are switched off.

CAM Device with Data/Mask-to-Quaternary Translator

FIG. 12 illustrates a circuit arrangement for reading and writing data in an array 302 of multi-compare quaternary CAM cells. An address decoder 338 activates one of a plurality of word lines indicated by an address value (ADDR) to enable read and write access to a selected row of CAM cells within the array 302 (i.e., the row of CAM cells selected by the address value). In a read operation, read circuitry within a read/write circuit 501 senses a data word output onto bit lines 502 from the selected row of CAM cells and outputs the data word, referred to herein as read data word, onto a data bus 508. The data bus 508 may be dedicated to providing read and write access to the CAM array 302, or may be time multiplexed with comparand data, result data and/or instruction data (e.g., the data bus 508 may be the CBUS 318, RBUS 328 or IBUS 320 of FIG. 3). In a write operation, a write data word is received via the data bus 508 and input to a data word translator 503. In one embodiment, the data word translator 503 generates a translated data word (also referred to herein as an encoded data word) based on data and mask bits within the incoming write data word, then selects, according to the state of a data select signal 506 (DSEL), either the translated data word or the write data word to be output to the read/write circuit 501 via write data path 510. Write driver circuits within the read/write circuit 501 drive the selected data word (i.e., the data word output from the data word translator 503) onto the bit lines 502 of the CAM array 302 for storage in an address-selected row of CAM cells. In an alternative embodiment, the data word translator 503 additionally receives a read data word from the read/write circuit 501 (e.g., via path 508) to enable a data word read from a source row of CAM cells within the CAM array 302 to be transferred to a destination row of CAM cells. In a first type of transfer operation, referred to herein as a copy operation, the content of the source row (i.e., the row of CAM cells which from which a read data word is read) is unaffected by the storage of the read data word in the destination row. In a second type of transfer operation, referred to herein as a move operation, the content of the source row is invalidated (e.g., by flipping one or more bits indicative of row validity, or by storing a predetermined value within the row) as part of the transfer operation. The source row may be invalidated during the data read operation (e.g., by driving bit lines coupled to a column of validity CAM cells to store an invalid state for the source row); after the data read operation, but prior to or during data word storage in the destination row; or after the data word is stored in the destination row. In another alternative embodiment, the data word translator 503 and data word selector may be omitted altogether, with any desired data word translation being performed by the write requester or other external circuitry.

FIG. 13 illustrates a more detailed embodiment of the circuit arrangement of FIG. 12. The data bus 508 is coupled to a write latch 535, and a read latch 531. The read latch 531 is coupled via a read data path 530 to a sense amplifier bank 525 within the read/write circuit 501. During a read operation, a read data word is output from a selected row of CAM cells within CAM array 302 onto bit lines 502, amplified by the sense amplifier bank 525, then output onto read data path 530. In one embodiment, the read data word is latched in the read latch 531 (or register) prior to being driven onto the data bus 508 by an output driver circuit (not shown in FIG. 13. In an alternative embodiment, the read latch 531 is omitted and the sense amplifier bank 525 is coupled directly to the output driver circuit. Also, an output enable signal (not shown) may be provided to the read latch 531 to set the output of read latch 531 to a high impedance state until such time as read data is to be output from the read latch 531 to the data bus 508 and/or write latch 535.

In a host write operation, data received via the data bus 508 is stored within a write latch 535. The write latch 535 includes a data latch 536 to store data bits of the write data word, and a mask latch 537 to store mask bits of the write data word. Note that the component storage circuits (i.e., latch circuits, register circuits or other storage elements for storing individual bits of data and mask information) within the data latch 536 and mask latch 537 may be arranged in pairs of adjacent data and mask storage circuits rather than in the separate data and mask circuit blocks 536 and 537.

The data and mask latches 536 and 537 are coupled to the data word translator 503 via signal lines 534. The data word translator 503 includes a number of translation sub-circuits 540 each coupled to receive a respective data bit and corresponding mask bit (i.e., a data/mask bit pair) from the data and mask latches 536 and 537, and each coupled to a data select line to receive the data select signal 506. In one embodiment, each of the translation sub-circuits 540 translates the data/mask bit pair into a quaternary data value in accordance with the translation table of FIG. 7, then outputs either the input data/mask bit pair or the quaternary data value onto a pair of output signal lines 542 depending on the state of the data select signal 506. As discussed in reference to FIG. 7, other quaternary encoding schemes may be used in alternative embodiments.

The signal lines 542 collectively form a write data path 541 for delivering the selected data word (i.e., translated data word formed by a set of quaternary data values, or input data word formed by the input data/mask bit pairs) to a write driver circuit 527 within the read/write circuit 501. The write driver circuit 527 drives the constituent bits of the selected data word onto the bit lines 502 for storage within an address-selected row of the CAM array 302.

In the embodiment of FIG. 13, each of the translation sub-circuits 540 is additionally coupled to receive a respective pair of bits via the read data path 530 (i.e., a portion of a read data word). During a copy or move operation, the data select signal 506 selects the read data path 530 to source the data word output onto the write data path 541 by the translation sub-circuits 540. In an alternative embodiment, copy and move operations may be unsupported and the connection of the read data path to the data word translator 503 may be omitted. Also, the connection of the read data path to the data word translator 503 may be omitted, and copy and/or move operations performed instead by routing a read data word through read latch 531 (if present) and back into the write latch 535.

Still referring to FIG. 13, it should be noted that read and write data words may be transferred to and from the CAM device in a sequence of transfers of component data values (e.g., two transfers of M/2 bits each to transfer a M-bit read or write data word). In the case of a write operation, each component data value may include data and mask bits and therefore may be translated by translate circuit 503 without regard to the content of subsequently received component values. Alternatively, corresponding data and mask bits may be transferred in distinct component values (e.g., data bits in a first transfer and mask bits in a subsequent transfer, or vice-versa). In such an embodiment, one or more component values may be buffered in the write latch 535 or other buffer circuitry until a full complement of data and mask information is received.

Figure 14:
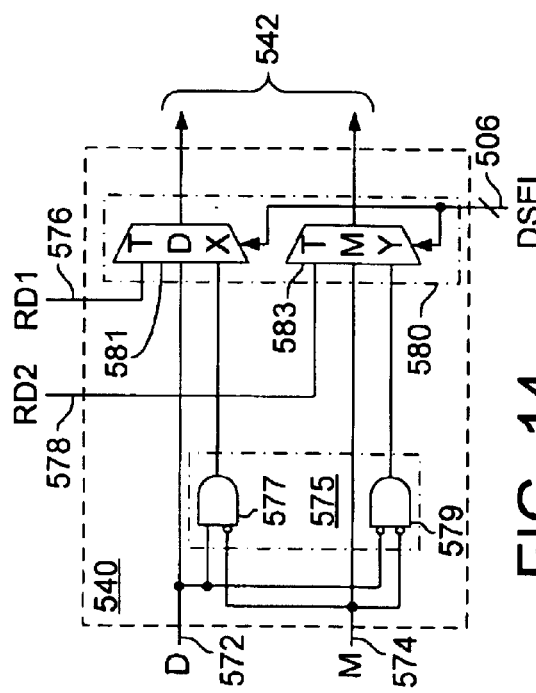
FIG. 14 illustrates a translation sub-circuit according to one embodiment.

FIG. 14 illustrates a translation sub-circuit 540 according to one embodiment. The translation sub-circuit 540 includes an encoding circuit 575 and a select circuit 580, each coupled to receive an input data signal 572 and input mask signal 574, the input signals constituting a component data/ mask bit pair of the input data word 534 of FIG. 13. The encoding circuit 575 includes a pair of logic gates 577 and 579, each coupled to receive the data signal 572 and the mask signal 574. In the specific embodiment of FIG. 14, logic gate 577 is an AND gate having a non-inverting input to receive the data signal 572 and an inverting input to receive the mask signal 574, and therefore outputs a constituent bit, X, of a quaternary data value according to the Boolean expression, X=D*/M, where "*" denotes a logic AND function. Logic gate 579; is an AND gate having respective inverting inputs to receive the data and mask signals 572, 574 and therefore outputs a constituent bit, Y, of a quaternary data value according to the Boolean expression, Y=/D*/M (note that logic gate 579 is functionally equivalent to a NOR gate). Thus, the encoding circuit 575 generates a quaternary data value in accordance with the table of FIG. 7. As discussed above, other encoding schemes may be used in alternative embodiments.

The select circuit 580 includes a pair multiplexers, 581 and 583, each having a select input coupled to receive the data select signal 506 (DSEL). In the embodiment of FIG. 14, each of the multiplexers 581, 583 has three input ports, and the data select signal 506 includes at least enough constituent bits to select one of the three input ports. Referring to multiplexer 581, a first input port (X) is coupled to receive the X-bit of the quaternary data value from the logic gate 577, a second input port (D) is coupled to receive the input data signal 572, and a third input port (T) is coupled to receive a first bit 576 (RD1) of a read data value (i.e., in support of transfer operations such as copy or move operations). In the second multiplexer 583, a first input port (Y) is coupled to receive the Y-bit of the quaternary data value from the logic gate 579, a second input port (M) is coupled to receive the input mask signal 574, and a third input port (T) is coupled to receive a second bit 578 (RD2) of the read data value. When the data select signal 506 is in a translate state, the select circuit 580 outputs the quaternary data value (i.e., translated bit pair output from the encoding circuit 575) onto write data lines 542. When the data select signal 506 is in a write-through state, the select circuit 580 outputs the input data/mask bit pair onto the write data lines 542 and, when the data select signal 506 is in a transfer state, the select circuit 580 outputs the pair of read data bits, RD1 and RD2, onto the write data lines 542.

In an alternative embodiment, the read data inputs to the multiplexers 581 and 583 are omitted and a single-bit data select signal 506 is used to select between the input bit pair and translated bit pair. In such an embodiment, move and/or copy operations may be achieved through routing of read data bits RD1 and RD2 to the data and mask inputs 572 and 574, or move and copy operations may be unsupported. Also, the multiplexers 581 and 583 may be implemented in a number of ways including, without limitation, using pass gates to allow data presented to the selected input port to pass through to the write data lines 542 (or at least to a next stage driving circuit for driving the write data lines 542), by logic gates (e.g., logic AND gates) used to pass only a DSEL-enabled data source to the write data lines 542, or any other circuit for selectively passing one of the multiple sources of data bits to the write data lines 542.

Figure 15:
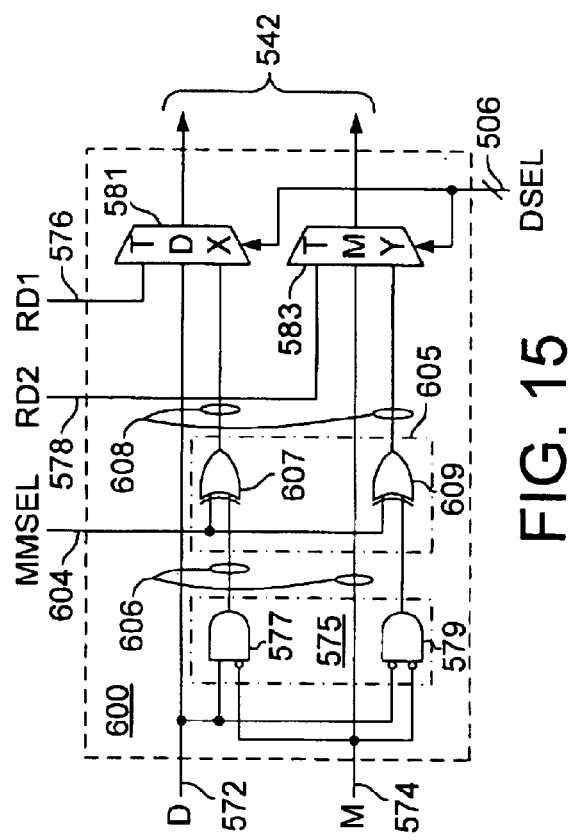
FIG. 15 illustrates a translation sub-circuit according to alternative embodiment.

FIG. 15 illustrates a translation sub-circuit 600 according to alternative embodiment. The translation sub-circuit 600 includes an encoding circuit 575 to translate an input data/mask bit pair 572/574 into a quaternary data value 606, and a select circuit to select either the input data/mask bit pair 572/574, a translated value 608, or a pair of read data bits 576, 578 (RD1 and RD2) to be output onto write data lines 542 according to the state of a data select signal 506 (DSEL). The translation sub-circuit 600 additionally includes a toggle circuit 605 to selectively invert the state of the quaternary data value 606 according to the state of a match-mode select signal 604 (MMSEL), and thereby enable selection between a forced-match state (XY=00) and a forced-mismatch state (XY=11) of the quaternary data value. In the embodiment of FIG. 15, the toggle circuit 605 includes a pair of exclusive OR gates 607 and 609 each having a first input coupled to receive the match mode select signal (MMSEL), and second inputs coupled to receive the X- and Y-bits, respectively, of the quaternary data value 606. By this arrangement, when the input mask signal 574 is high and the match-mode select signal 604 is low, the forced-match state of the quaternary data value 606 (i.e., XY=00) is output from the toggle circuit 605 without change as the translated value 608. When the input mask bit 574 and the match-mode select signal 604 are both high, the toggle circuit 605 flips the forced-match state of the quaternary data value 606 to the forced-mismatch state, XY=11, in the translated data value 608. Note that logic '1' and logic '0' quaternary values are also complemented when the match-mode select signal is high. In an alternative embodiment, the match-mode select signal 604 may be ANDed with the input mask bit before being applied to the XOR gates 607 and 609 so that the logic '1' and logic '0' states of the quaternary data value 606 are unchanged in the translated data value 608, regardless of the state of the match-mode select signal. In either embodiment, the match-mode select signal 604 may be used to select between forced-match and forced-mismatch quaternary values for each input data/mask bit pair in which the mask bit 574 is set. The forced-match state is useful, for example, to achieve the local masking function described in reference to FIG. 5, and the forced-mismatch state is useful, for example, to ensure that a mismatch condition is signaled by a given row of CAM cells, in effect invalidating the row. Both states, forced-match and forced-mismatch may also be used for other purposes including, without limitation, device testing operations.

In one embodiment, the data select signal 506 of FIGS. 12–15 is generated by the instruction decoder 312 of FIG. 3 in response to an instruction received via IBUS 320. For example, when a write-direct instruction is received by the instruction decoder 312, the instruction decoder 312 outputs the data select signal 506 in the write-through state to select the untranslated data word (i.e., the input data word received via the data bus 508) to be written to the CAM array 302. (Note that the write-direct instruction may be used for any number of purposes including, without limitation, device testing and for writing forced-mismatch data into selected CAM cells of the CAM array 302.) By contrast, when a write-translate instruction is received by the instruction decoder 312, the instruction decoder 312 outputs the data select signal 506 in the translate state to select the translated data word to be written to the CAM array 302. When a copy instruction or move instruction is received by the instruction decoder 312, the instruction decoder 312 outputs the data select signal 506 in the transfer state to select the read data word to be written back to the CAM array at the copy or move destination.

In an alternative embodiment, a configuration circuit within the CAM device 300 of FIG. 3 may be run-time or production-time programmed with a data select value (e.g., in response to a host instruction or via signals delivered by external programming equipment) to establish the state of the data select signal 506. The configuration circuit may be a register, latch, non-volatile memory, fusible circuit or any other circuit capable of storing or generating a data select value. As with the data select signal 506, the match-mode select signal 604 of FIG. 15 may be generated by the instruction decoder 312 of FIG. 3 (or other control circuit) in response to a host instruction, or by a configuration circuit programmed with a match-mode select value.

Multi-Word Compare

Referring again to FIG. 5, the CAM array 350 and constituent CAM cells 351 may be viewed as having multiple compare ports, with odd compare line pairs 362/364 forming an odd compare port and even compare line pairs 358/360 forming an even compare port. As discussed, additional compare lines may be provided and coupled to additional compare circuits within the CAM cells 351 to enable additional simultaneous compare operations or pipelined compare operations. Thus, the CAM array 350 may have any number of compare ports to enable any number of simultaneous compare operations or pipelined compare operations. In embodiments of the invention, the multiple compare ports are used to perform single-cycle compare operations and multi-cycle compare operations on comparand values that exceed the row size of the CAM array (i.e., comparand values having more than M constituent bits). For example, in one embodiment, a double-word compare operation is performed by simultaneously applying first and second component words of a double-word comparand to odd and even compare ports of a CAM array. Match results for the two words of the double-word comparand are generated on odd match lines and even match lines, respectively. Thus, if a double-word data value that matches the double-word comparand is stored in adjacent rows of the CAM array, then the odd match line for one of the rows will indicate a match (i.e., between the stored data word and the component word applied via the odd compare port), and the even match line for the other of the rows will also indicate a match (i.e., between the stored data word stored and the component word applied via the even compare port). Accordingly, by combining the odd and even match results for adjacent rows of CAM cells, a set of double-word match signals may be generated, each double-word match signal indicating whether the double-word comparand applied via the odd and even compare ports matches a double-word data value stored in a corresponding pair of CAM cell rows.

FIG. 16 illustrates a CAM device 640 having a double-word compare function according to an embodiment of the invention. The CAM device includes a CAM array 350 and match circuitry 650. Although not shown in FIG. 16, the CAM device 640 may additionally include address circuitry and read/write circuitry for reading and writing data in the CAM array 350; an instruction decoder or other control circuit to receive instructions via an instruction interface (e.g., instruction bus coupled between the CAM device 640 and a host processor, network processor and/or other control device) and to generate control and timing signals for carrying out the instructed compare operations and CAM array accesses; a configuration circuit for storing run-time and/or production-time programmable information that establishes one or more programmable modes of operation within the CAM device; error checking circuitry; status circuitry; and so forth.

The CAM array 350 operates generally as described above in reference to FIG. 5 and includes even and odd compare ports formed by even compare line pairs $358/360_1$–$358/360_M$ and odd compare line pairs $362/364_1$–$362/364_M$, respectively. In one embodiment, even and odd compare words are applied simultaneously to the constituent compare lines of the even and odd compare ports, as shown. In response, each row of CAM cells (e.g., N rows of CAM cells 351 depicted in FIG. 5) within the CAM array 350 outputs an odd match signal on a respective one of odd match lines $324_1$–$324_N$ (also referred to herein as odd match lines $OML_1$–$OML_N$) and an even match signal on a respective one of even match lines $322_1$–$322_N$ (also referred to herein as even match lines $EML_1$–$EML_N$).

The match circuitry 650 includes expansion circuits $651_1$–$651_{N/2}$ and a priority encoder 670. Each of the expansion circuits $651_1$–$651_{N/2}$ is coupled to an odd match line 324 and even match line 322 from a respective pair of adjacent CAM rows (a CAM row being a row of CAM cells). For example, expansion circuit $651_1$ is coupled to even match line $322_1$ of CAM row one and to odd match line $324_2$ of CAM row two. Similarly, expansion circuit $651_{N/2}$ is coupled to even match line $322_{N-1}$ of CAM row N–1 and to even match line $324_N$ of CAM row N. Because one expansion circuit 651 is provided for each pair of CAM rows, there are half as many expansion circuits as CAM rows. In a generalized embodiment in which X compare ports are used to compare component words of an X-word comparand with corresponding contents in X rows of the CAM array, N/X expansion circuits are provided, with each expansion circuit combining the results of X match signals that correspond to the X compare ports.

Each of the expansion circuits 651 includes an AND gate 663 having inputs coupled to an odd match line 324 and an even match line 322 from respective rows of the CAM array 350 and therefore generates a match signal 664, referred to herein as a composite match signal (or resultant match signal), that indicates a match if both the constituent match signals 322 and 324 indicate a match, and that indicates a mismatch if either of the constituent match signals 322 and 324 indicates a mismatch. In one embodiment, the composite match signal 664 is selectively provided to an odd-match priority encoding circuit 673 within priority encoder 670 in place of a corresponding odd match signal 324. Referring to expansion circuit $651_1$, for example, the composite match signal 664 and the odd match signal $324_2$ are supplied to respective input ports of a select circuit 665 (e.g., a multiplexer) which selects, according to the state of a word-length select (WLS) signal 675 supplied to a select input of the select circuit 665, either the composite match signal 664 or the odd component match signal $324_2$ to be output as a selected match signal 668. Thus, the word-length select signal effectively selects between a double-word compare mode and a single-word compare mode within the CAM device 640.

Still referring to FIG. 16, the selected match signal 668 is input to the odd priority encoder to enable generation of a match index (i.e., address of row or row pair that sourced the highest priority match, also referred to herein as a match address). Note that application of the odd component match signal 324 to the input of multiplexer 665 rather than the even component match signal 322 is arbitrary. In an alternative embodiment, the multiplexer may select between the even component match signal 322 and the composite match signal 664, and output the selected match signal to the even priority encoding circuit 672. In either case, by selectively outputting either the composite match signal 664 or one of the component match signals (322 or 324) to the appropriate priority encoding circuit 672 or 673, the number of match signals supplied to the priority encoding circuits 672 and 673 is unchanged. The word-length select signal 675 may also be provided to one or both of the priority encoding circuits 672 and 673 so that, if the word-length select signal 675 indicates a double-word length (i.e., selecting the composite match signal 664), the priority encoding circuit that receives the odd or even component match signal (i.e., the signal not passed through the select circuit 665) will be prevented from indicating a match condition. Alternatively, the word-length select signal 675, or another control signal may be used to select which of the priority encoding circuits 672 and 673 is to output a match index, and therefore may select the priority encoding circuit coupled to receive the selected output signal 668 if a double-word length is selected.

In an alternative embodiment, rather than selecting between the composite match signal 664 and a component match signal, the composite match signal 664 may be provided to a priority encoding circuit 673 in addition to the component match signal. In such an embodiment, the select circuit 665 may be omitted from the expansion circuits 651 altogether. In another embodiment, a third priority encoding circuit, not shown in FIG. 16, may be provided to receive the composite match signal 664 and may be selected, by appropriate state of the word-length select signal 675, to source the match index instead of or in addition to priority encoding circuits 672 and 673.

In an alternative embodiment, an additional expansion circuit 651 may be provided per pair of CAM cell rows and used to generate a second composite match signal based on the state of the match lines 322, 324 that are not coupled to the existing expansion circuit. For example, an additional expansion circuit 651 may be coupled to odd match line $324_1$ and even match line $322_2$ to generate a composite match signal according to the states of component match signals on those match lines. The word-length select signal 675 or a separate select signal may be supplied to a select circuit (not shown) to select either the composite match signal or the component match signal on odd match line $324_1$ to be output to the priority encoding circuit 673. Alternatively, the word-length select signal 675 (or separate select signal) may be input to a select circuit to select either the composite match signal or the component match signal on even match line $322_2$ to be output to the priority encoding circuit 672. Also, the component match signal on match line $324_2$ may be sent to one or both of the priority encoding circuits 672, 673 in addition to the component match signals on match lines $322_1$, $322_2$, $324_1$ and the composite match signal 668.

In one embodiment, the word-length select signal 675 is generated by the instruction decoder (or other control circuit) in response to instructions received from a host processor, network processor or other control device. For example, if an instruction specifies a double-word compare operation, then the word-length select signal is asserted at an appropriate time relative to application of corresponding odd and even component comparand words to the odd and even compare ports of the CAM array 350. In an alternative embodiment, the word-length select signal 675 is programmed into a configuration circuit of the CAM device at run time or production time as described above in reference to FIG. 3.

Still referring to FIG. 16, it should be noted that the states of the even and odd match lines 322 and 324 may be latched in a latching circuit or registered in a storage register prior to being supplied to the expansion circuits 651, thereby enabling the match lines to be precharged in preparation for a subsequent compare operation while the expansion circuits 651 generate composite match signals 668 using the latched or registered match results. It should also be noted that the storage order of component data words of a double-data word determines the compare ports on which the component words of the double-word comparand are to be applied. That is, if the most significant word (MSW) of a double-data word is to be compared with a component comparand word applied via the odd compare port (and therefore the least significant word of a double-data word is to be compared with a component comparand word applied via the even compare port), then the MSW is stored in the higher numbered row of a given row pair (thereby to generate the odd match signal 324 supplied to the expansion circuit 651 during a compare operation), and the LSW is stored in the lower numbered row of the row pair (thereby to generate the even match signal supplied to the expansion circuit during a compare operation). The storage positions may be reversed to achieve the opposite component comparand association (i.e., MSW compared with even compare word, and LSW compared with odd comparand).

Although each of the CAM cells 351 are described in reference to FIG. 5 as having, two memory cells to enable storage of quaternary data values, CAM cells having only a single memory cell may be used within the CAM array of FIG. 16. For example, in one embodiment, each CAM cell includes a single memory cell coupled to multiple compare circuits, the memory cell outputting, for example, a data bit and complementary data bit to each compare circuit. In an alternative embodiment, each CAM cell includes a memory cell and a mask cell, the mask cell being used to interrupt the path between the match line and a reference potential (e.g., ground), or to interrupt the path between compare lines and the CAM cell compare circuits (or any one or more of the compare circuits) or to interrupt the path between the memory cell and the compare circuits. Examples of these and other CAM cells which may be used within the CAM array of FIG. 16 are disclosed in U.S. Pat. No. 6,137,707 which is hereby incorporated by reference in its entirety.

Figure 17:
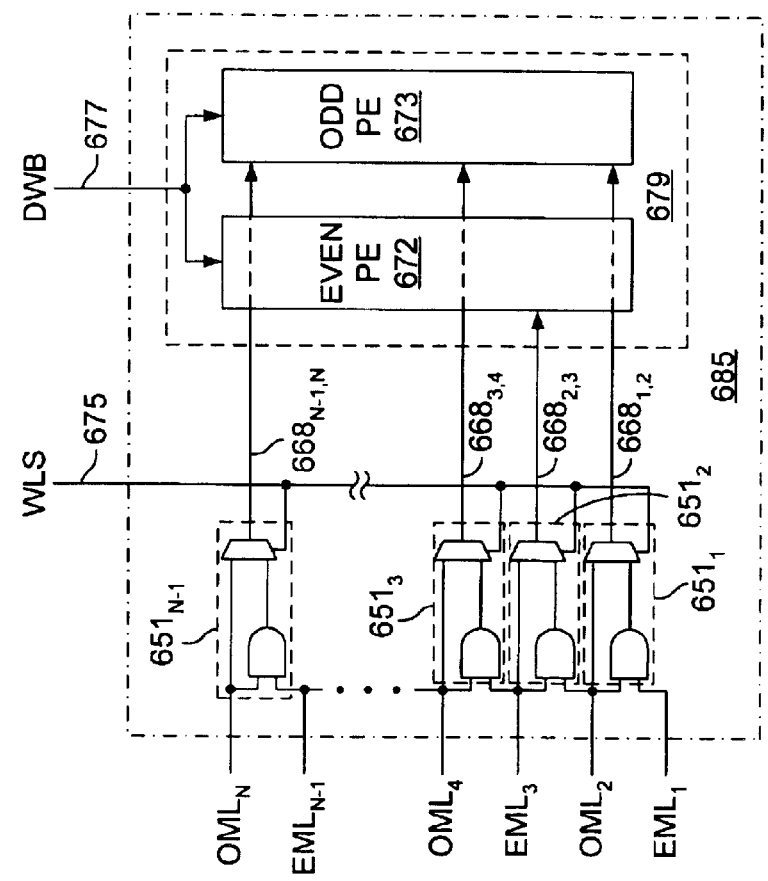
FIG. 17 illustrates match circuitry that may be used in place of the match circuitry of FIG. 16 in an alternative embodiment.

FIG. 17 illustrates match circuitry 685 that may be used in place of the match circuitry 650 of FIG. 16 in an alternative embodiment. In contrast to the match circuitry 650 which includes one expansion circuit for each distinct pair of adjacent CAM rows (N/2 expansion circuits in all), match circuitry 685 includes N−1 expansion circuits $651_1$–$651_{N-1}$, one expansion circuit for each adjacent pair of CAM rows. That is, a match line for each CAM row, except the first and last CAM rows, is supplied to two different expansion circuits 651, thereby generating a composite match signal for each adjacent pair of CAM rows. For example, match line $OML_2$ is coupled to expansion circuit $651_1$ and to expansion circuit $651_2$. Expansion circuits $651_1$ and $651_2$ are additionally coupled to receive match lines $EML_1$ and $EML_3$, respectively, and therefore generate respective composite match signals $668_{1,2}$ and $668_{2,3}$ (the subscript indicating the CAM rows that sourced component match signals). Thus while the N/2 expansion circuits 651 of FIG. 16 generate composite match signals for CAM row pairs 1/2, 3/4, 5/6, . . . , N−3/N−2, N−1/N, the N−1 expansion circuits 651 of FIG. 17 generate composite match signals for CAM row pairs 1/2, 2/3, 3/4, . . . , N−2/N−1, N−1/N.

One application of the match circuitry 685 is to enable storage of double-word data values starting at either odd or even CAM row boundaries. That is, in contrast to the embodiment of FIG. 16 in which double-word data values are stored on odd-row boundaries (i.e., double-word data value spans from an odd-numbered CAM row to a higher, even-numbered CAM row (e.g., 1 to 2, 3 to 4, etc.)), double-word data values may additionally be stored on even-row boundaries (e.g., 2 to 3, 4 to 5, etc.). When the word-length select signal 675 selects a double-word compare mode, the composite match signals resulting from matches with double-word data values stored on odd-row boundaries (i.e., odd-bound composite match signals $668_{1,2}$, $668_{3,4}$, etc.) are output to an odd priority encoding circuit 673 within the priority encoder 679, and the composite match signals resulting from matches with double-word data values stored on even-row boundaries (i.e., even-bound composite match signals $668_{2,3}$, $668_{4,5}$, etc.) are supplied to an even priority encoding circuit 672 within the priority encoder 679. In the embodiment of FIG. 17, a double-word boundary signal 677 (DWB) is supplied to the even and odd priority encoding circuits 672 and 673 to disable one priority encoding circuit or the other according to a selected double-word boundary. For example, if an odd double-word boundary is selected (e.g., by instruction, programmed mode, etc.) and a double-word compare mode is enabled, the double-word boundary signal 677 is set to a first state to enable match address encoding within the odd priority encoding circuit 673 and to disable match address encoding within the even priority encoding circuit 672. This may be accomplished, for example, by selectively disabling match indications at an input to the encoding logic within circuits 672 and 673 (e.g., by ANDing even-bound composite match signals with the double-word boundary select signal and ANDing odd-bound composite match signals with a complement of the double-word boundary select signal), selectively disabling an output of the priority encoding circuits 672 and 673, or disabling other logic functions within the priority encoding circuits 672 and 673. It should be noted that the CAM row numbering in FIG. 17 may alternately start at zero and extend to N−1, in which case the semantic of odd and even double-word boundaries may be reversed.

A number of changes may be made to match circuitry 685 of FIG. 17 without departing from the scope of the present invention. For example, the double-word boundary select signal may be omitted in an alternative embodiment, and both the odd and even priority encoding circuits 672 and 673 enabled to generate double-word match signals. Also, an additional expansion circuit 651 may be provided and coupled to the $EML_1$ and $OML_N$ lines so that a double-word data value having components stored in the first and last rows may generate a match indication during a double-word compare (such additional expansion circuit will result in an equal number of odd-bound and even-bound composite match signals when the total number of CAM rows is an even number). Also, as in the embodiment of FIG. 16, the select circuits within the expansion circuits 651 may be omitted. In such an embodiment, the even match lines, $EML_1$–$EML_N$, may be provided to the even priority encoding circuit 672 along with the even-bound composite match signals, and the odd match lines, $OML_1$–$OML_N$, may be provided to the odd priority encoding circuit 673 along with the odd-bound composite match signals. Also, as discussed in reference to FIG. 16, one or more separate priority encoding circuits may be provided to receive the composite match signals 668.

Figure 18:
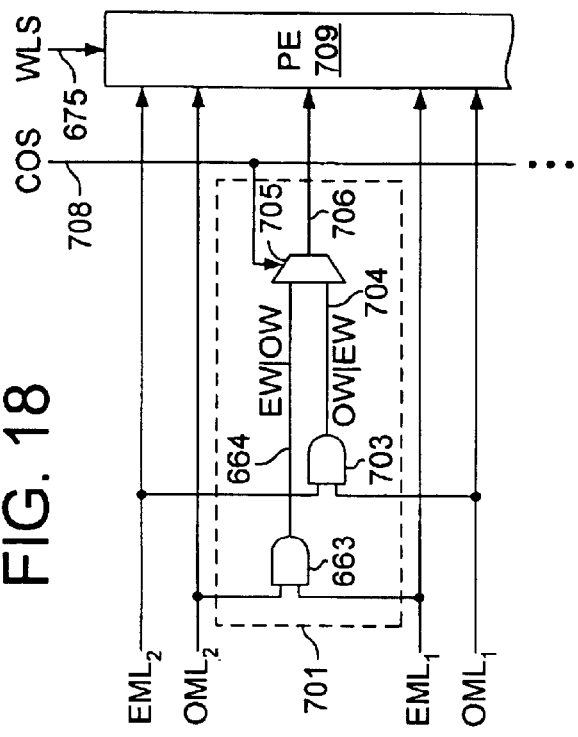
FIG. 18 illustrates an alternative expansion circuit that may be used in place of the expansion circuit of FIG. 16.

FIG. 18 illustrates an alternative expansion circuit 701 that may be used in place of the expansion circuit 651 of FIG. 16. The expansion circuit 701 receives two pairs of even and odd match signals, one even/odd pair from each row of an adjacent pair of CAM rows. The expansion circuit 701 includes a first AND gate 663 coupled to receive an even match signal $322_1$ from the lower numbered row of the row pair (row one in this example), and an odd match signal $324_2$ from the higher numbered row of the row pair (row two in this example). The expansion circuit 701 also includes a second AND gate 703 coupled to receive an odd match signal $324_1$ from the lower numbered row and an even match signal from the higher numbered row. Assuming for the sake of example, that the MSW of the stored double-data word is stored in the lower numbered row, then AND gate 663 generates a composite match signal 664 for a double-word comparand in which the even component comparand word is the MSW and the odd component comparand word is the LSW. That is, the composite match signal 664 indicates the match status for a comparand value having even-word|odd-word word ordering (EW|OW). Conversely, AND gate 703 generates a composite match signal 704 for a double word comparand in which the odd component comparand word is the MSW and the even component comparand word is the LSW (OW|EW). In the embodiment of FIG. 18, the composite match signals 664 and 704 for the two different component word orderings, are input to respective ports of a select circuit 705 (e.g., a multiplexer) that selects one of the composite match signals 664, 704 according to the state of a comparand-order select signal 708 (COS) supplied to a select input of the select circuit 705. Thus, the comparand-order select signal 708 is driven to a first state (e.g., logic high) if the even comparand word is the MSW of a double-word comparand, and to a second state if the odd comparand word is the MSW, thereby selecting either composite match signal 664 or composite match signal 704, respectively, to be output as a selected composite match signal 706. As with the word-length select signal described above, the comparand-order select signal 708 may be specified in incoming compare instructions (e.g., each double-word compare instruction to include a bit that indicates the word ordering), or programmed within a configuration circuit. In another embodiment (which may be a programmable mode selection or specified by incoming instructions), each double-word compare operation may be performed in two successive component compare operations in which the state of the comparand-order select signal is alternated. By this operation, both comparand word orderings are searched for each double-word compare operation. In such an embodiment, the comparand-order select signal 708 may be alternated between states in response to a match strobe signal, match latch signal or other timing signal.

In the embodiment of FIG. 18, the selected composite match signal 706 is output to a priority encoder 709 along with the even and odd match signal pairs from each CAM row. The priority encoder 709 may include even and odd component priority encoding circuits as in FIG. 16, with a word-length select signal 675 being provided to enable one of the priority encoding circuits and disable the other (i.e., enabling the priority encoding circuit that receives the selected composite match signal). In an alternative embodiment, the select circuit 705 is omitted from the expansion circuit 701, and the composite match signals 664 and 704 provided to the even and odd priority encoding circuits, respectively, within priority encoder 709. In such an embodiment, the comparand-order select signal 708 and word-length select signal 675 are provided to each of the priority encoding circuits within the priority encoder 709 to enable one or both of the priority encoding circuits to generate a match index. For example, if the word-length select signal 675 indicates a single-word compare operation, then both component priority encoding circuits are enabled. If the word-length select signal 675 indicates a double-word compare operation, then one or the other of the priority encoding circuits are disabled according to the state of the comparand-order select signal 708, the comparand-order select signal 708 selecting the component priority encoder that receives the composite match signal for the desired word order. In such an embodiment, the composite match signals 664 and 704 may be selected to source match information (i.e., to the match index generating logic within the priority encoding circuits) instead of the component match signals, the selection being performed in response to the word-length select signal 675 by selection circuitry within or external to the priority encoder 709. In an alternative embodiment, an additional, dedicated priority encoding circuit is provided in priority encoder 709 and coupled to receive the composite match signals 664 and 704 or, if select circuit 705 is provided, the selected composite match signal 706.

Figure 19:
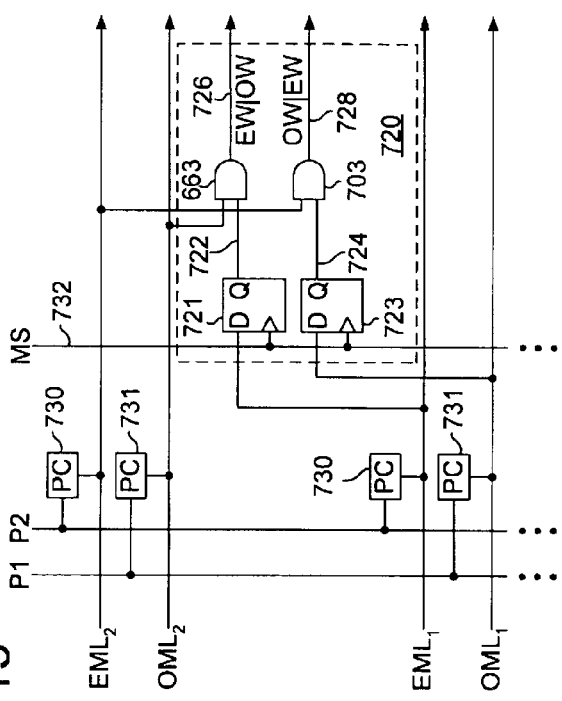
FIG. 19 illustrates an expansion circuit according to another embodiment.

FIG. 19 illustrates an expansion circuit 720 according to another embodiment. The expansion circuit 720 is similar to the expansion circuit 701 of FIG. 18, except that the select circuit 705 has been omitted (the select circuit may be provided in an alternative embodiment) and a pair of storage circuits 721 and 723 have been provided to store the state of match lines 322, and 3241, respectively, for one compare cycle. By this arrangement, match signals generated in a series of pipelined compare operations may be used to generate composite match signals 726 and 778. More specifically, AND gate 663 receives an even match signal 722 generated on even match line 322, and stored in storage circuit 721 at the end of a given compare cycle, and an odd match signal generated on odd match line $324_2$ during the immediately succeeding compare cycle. Similarly, AND gate 703 receives an odd match signal 724 generated on odd match line 324, and stored in storage circuit 723 at the end of a given compare cycle, and an even match signal generated on even match line $322_2$ during the immediately succeeding compare signal. A match strobe signal 732 (which may additionally be used to control the operation of match latching circuits, not shown) is used to strobe the match results (or pass the match results) into storage circuits 721 and 723. Note that, while depicted as edge-triggered circuits (i.e., flip-flops) in FIG. 19, the storage circuits 721 and 723 may alternatively be implemented using bi-stable latches or any other circuits or devices capable of storing the state of the match signals on lines 322 and 324.

In the embodiment of FIG. 19, precharge circuits 730 and 731 are used to precharge the even and odd match lines, respectively, in response to assertion of precharge enable signals P1 and P2. More specifically, during even compare cycles (i.e., in which even match signals are generated on match lines 322), precharge enable signal P1 is asserted (e.g., to a high state) to precharge the odd compare lines 324. Conversely, during odd compare cycles, precharge enable signal P2 is asserted to precharge the even compare lines 322. By this operation, the precharge operations for a given set of match lines, even or odd, are hidden by the compare operation in the counterpart set of match lines. This operation may be extended to any number of sets of match lines in alternative embodiments. The precharge signals may be asserted by an instruction decoder or any other circuit within the CAM device capable of generating precharge timing signals.

Figure 20:
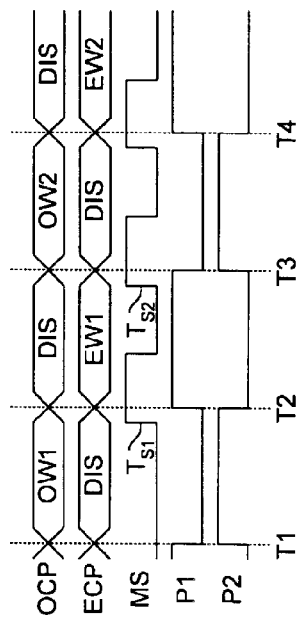
FIG. 20 is a timing diagram of the operation of the expansion circuit of FIG. 18 according to one embodiment.

FIG. 20 is a timing diagram of the operation of the expansion circuit 720 of FIG. 19 according to one embodiment in the period between times T1 and T2, an odd word, OW1, is input to the CAM array via the odd compare port (OCP) to enable generation of match signals on odd match lines 324. During the same period, the even compare port (ECP) is disabled (the disabled data state being indicated by a low waveform in FIG. 20), and the precharge enable signal, P2, is asserted to precharge the even match lines. At $T_{S1}$, shortly prior to the commencement of a new compare cycle at T2, the match strobe signal 732 (MS) is asserted to capture the state of the odd match line 324, within storage circuit 723. As discussed, such capture may be one cycle delayed if match latching circuitry is provided to latch the match line states during each compare cycle. Between times T2 and T3, an even compare word, EW1, is input to the CAM array via the even compare port (ECP) to enable generation of match signals on even match lines 322. During the same period, the odd compare port (OCP) is not driven, and the precharge enable signal, P1, is asserted to precharge the odd match lines 324. Prior to the next match strobe signal edge at TS2, the match signals become valid on even match lines 322 and therefore enables generation of a composite match signal 728 that includes the stored odd match signal component 724 and the newly generated even match signal $322_2$. At time $T_{S2}$, the match strobe signal is asserted to store the even match result in storage circuit 721. Then, at time T3, another odd compare word, OW2, is applied via the odd compare port to generate another set of odd match signals 324. After the odd match results become valid, and prior to the next rising edge of the match strobe signal, a composite match signal 726 is generated that includes the stored even match signal 722 and the newly generated odd match signal $324_2$. Interleaved odd and even compare operations are continued in this manner and combined in the expansion circuit 720 to generate successive composite match signals 726 and 728 that reflect the most recent two sets of match signals (i.e., match signals for OW1|EW1, followed by EW1|OW2, OW2|EW2, EW2|OW3 and so forth). As discussed above in reference to FIG. 19, if only one of the two possible word orderings is desired in a given application, the composite match signal for the other possible word ordering may be ignored. Alternatively, the storage circuit and logic gate used to generate the composite match signal for the other word ordering may be omitted from the expansion circuit 720.

Figure 21:
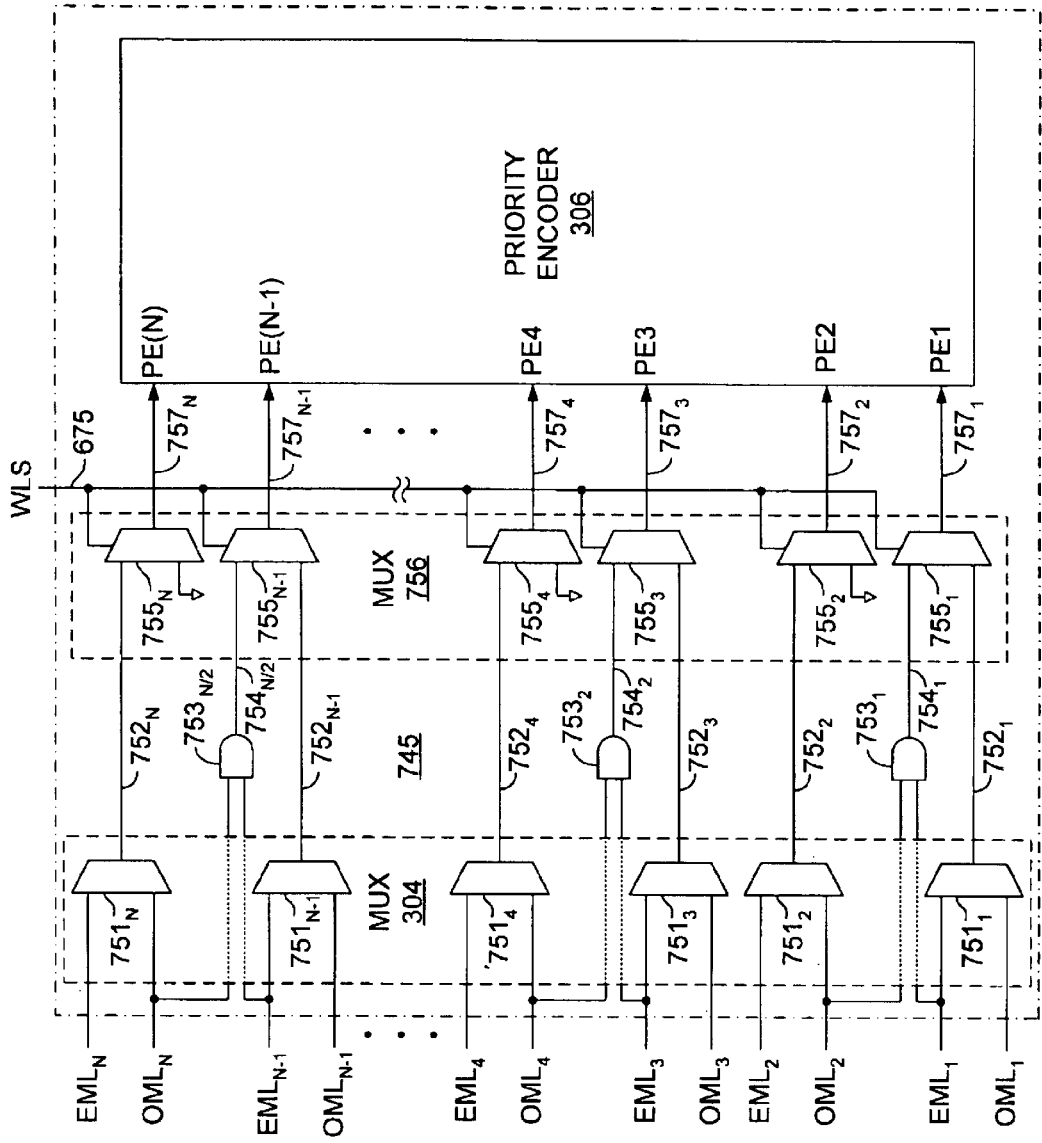
FIG. 21 illustrates match circuitry that may be used in place of the match circuitry of FIG. 16 in an alternative embodiment.

FIG. 21 illustrates match circuitry 745 that may be used in place of the match circuitry 650 of FIG. 16 in an alternative embodiment. The match circuitry 745 includes a first stage multiplexer 304, logic AND gates $753_1$–$753_{N/2}$, second stage multiplexer 756, and priority encoder 306. The first stage multiplexer 304 corresponds to the multiplexer 304 of FIG. 3 and includes component multiplexers $751_1$–$751_N$ to select either odd or even match signals (i.e., the signals on odd match lines, $OML_1$–$OML_N$, or the signals on even match lines, $EML_1$–$EML_N$) to be output as first stage match signals $752_1$–$752_N$. As discussed above in reference to FIG. 3, an instruction decoder may issue one or more signals to the multiplexer 304 to control the selection between even and odd match signals, or other logic may be used to control the selection. In one embodiment, when the CAM device containing match circuitry 745 is operated in a single-word compare mode, the match signal selection in multiplexer 304 is alternated from one compare cycle to the next to alternately output even match signals and odd match signals as the first-stage match signals 752.

The second-stage multiplexer 756 includes component multiplexers $755_1$–$755_N$, each having a first input port coupled to receive a respective one of the first-stage match signals $752_1$–$752_N$. A word-length select signal 675 is supplied to a select input of the component multiplexers $755_1$–$755_N$ and, in the single-word compare mode, is set to select the first-stage match signals $752_1$–$752_N$ to be output as final match signals $757_1$–$757_N$. By this operation, even and odd match signals are alternately supplied to the N inputs of priority encoder 306 (i.e., PE1–PE(N)) which operates as described in reference to FIG. 3 to generate corresponding even and odd match addresses.

Each of the logic AND gates $753_1$–$753_{N/2}$ is coupled to receive a respective even/odd match signal pair from a corresponding, distinct pair of the even and odd match lines. For example, AND gate $753_1$ is coupled to receive an even match signal from even match line $EML_1$ and an odd match signal from odd match line, $OML_2$; AND gate $753_2$ is coupled to receive an even match signal from even match line $EML_3$ and an odd match signal from odd match line $OML_4$; and so forth to AND gate $753_{N/2}$ which is coupled to receive an even match signal from even match line $EML_{N-1}$, and an odd match signal from odd match line $OML_N$. Consequently, each of the AND gates $753_1$–$753_{N/2}$ combines an even match signal and an odd match signal from an adjacent pair of CAM rows to generate a respective one of composite match signals $754_1$–$754_{n/2}$. In the embodiment of FIG. 21, the composite match signals $754_1$–$754_{N/2}$ are supplied to a second input of every other one of component multiplexers 755 within the second stage multiplexer 756. The second input of component multiplexers not coupled to receive composite match signals 754 are coupled to a mismatch-indicating reference voltage (ground in this example). Thus, the second input of component multiplexer $755_1$ is coupled to receive composite match signal 754, from AND gate $753_1$, while the second input of component multiplexer $755_2$ is grounded. Similarly, the second input of component multiplexer $755_3$ is coupled to receive composite match signal $754_2$ from AND gate $753_2$, while the second input of component multiplexer $755_4$ is grounded. Consequently, when the word-length select signal 675 is set to select the signals at the second inputs of component multiplexers 755 (i.e., in double-word compare mode), the composite match signals $754_1$, $754_2$, ..., $754_{N/2}$ are output to the priority encoder 306 as the final match signals $757_1$, $757_3$, ..., $757_{N-1}$, respectively. The grounded second inputs of the even-subscripted component multiplexers (i.e., $755_2$, $755_4$; $755_N$) prevents match indication at the even numbered priority encoder inputs, PE2, PE4, ..., PE(N).

In the embodiment of FIG. 21, a double-word compare operation is performed by simultaneously generating match results on the even and odd match lines pairs EML/OML$_1$–EML/OML$_N$ (e.g., by simultaneous application of component comparand words on even and odd compare ports), so that any double-word match will result in a corresponding one of the composite match signals 754$_1$–754$_{N/2}$ being asserted (e.g., at a logic high state). Consequently, during a double-word compare operation, the priority encoder 306 will generate a match address that corresponds to the lowest numbered row of the pair of adjacent CAM rows containing the matching double-word data value.

Numerous changes may be made to the matching circuitry 745 of FIG. 21 without departing from the scope of the present invention. For example, more than two component match signals (i.e., even and odd match signal pairs) may be combined to form composite match signals 754 in an alternative embodiment. Also, either the even or odd match signals may be latched or registered in another alternative embodiment to permit generation of composite match signals 754 based on component match signals generated in different compare cycles. In another alternative embodiment, the even-subscripted component multiplexers 755$_2$, 755$_4$, ..., 755$_N$ may be used to select the composite match signals in double-word compare mode, and the second inputs of the odd-subscripted component multiplexers 755$_1$, 755$_3$, ..., 755$_{N-1}$ grounded, Also, selection between the odd-subscripted and even-subscripted multiplexers 755 (i.e., as composite-match signal selector) may be made programmable to enable generation of match addresses that correspond to either the even CAM rows or the odd CAM rows according to application needs. In other embodiments, additional logic AND gates 753 may be provided to enable combination of match signals from both even- and odd-bounded pairs of CAM rows. Also, expansion circuits that allow different component word orderings (e.g., as described in reference to FIG. 18) may be used in alternative embodiments.

Figure 22:
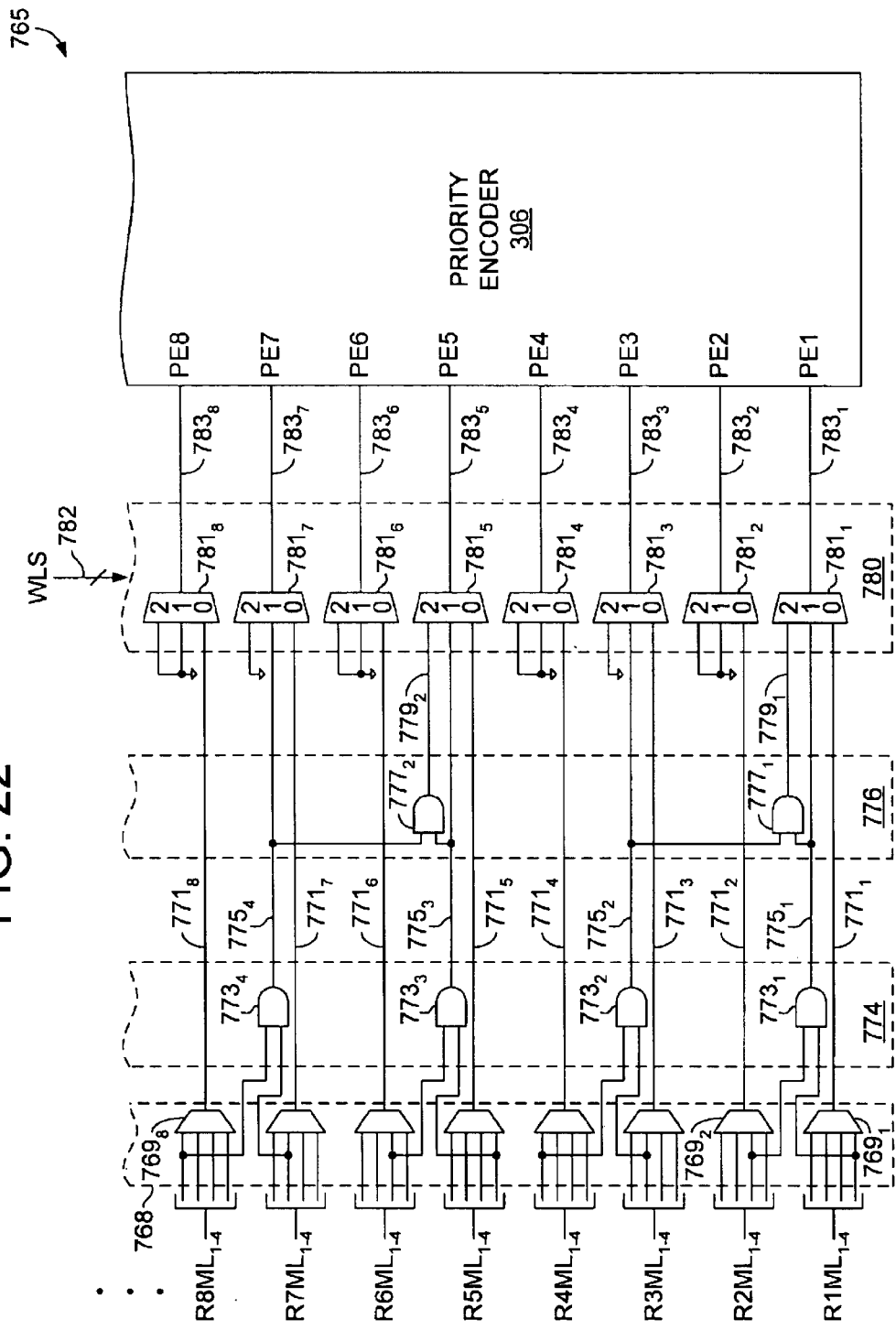
FIG. 22 illustrates match circuitry for generating multiple sets of composite match signals according to one embodiment.

FIG. 22 illustrates match circuitry 765 for generating multiple sets of composite match signals according to one embodiment. The match circuitry 765 includes a first stage multiplexer 768, first stage logic circuit 774, second stage logic circuit 776, second stage multiplexer 780, and priority encoder 306. The first stage multiplexer 768 includes component multiplexers 769$_1$–769$_N$ (only the first eight of which are shown in FIG. 22) each coupled to a respective set of four match lines from CAM rows 1 to N. For example, component multiplexer 769$_1$ is coupled to receive respective match signals from match lines 1–4 from CAM row one (i.e., R1ML$_{1-4}$), component multiplexer 7692 is coupled to receive respective match signals from match lines 1–4 from CAM row two (R2ML$_{1-4}$), and so forth.

In one embodiment, each of the four match lines within a given set is coupled to a respective set of compare circuits within the CAM cells of the corresponding row. For example, match line R1ML$_1$ is coupled to a first compare circuit within each CAM cell of the first CAM row, match line RI ML$_2$ is coupled to a second compare circuit within each CAM cell of the first CAM row, match line R1ML$_3$ is coupled to a third compare circuit within each CAM cell of the first CAM row, and match line R1ML$_4$ is coupled to a fourth compare circuit within each CAM cell of the first CAM row. In such an embodiment, four compare ports may be provided within the CAM array to enable four simultaneous comparison operations within the rows of CAM cells, thereby generating match signals simultaneously on each of the four match lines per CAM row.

In an alternative embodiment, a first pair of match lines within each set of four is coupled to the CAM cells of the corresponding row and also to a pair of storage elements to store the match results for each compare cycle. The second pair of match lines is coupled to receive the output of the storage elements so that, during each compare cycle, the first pair of match lines indicates the match results for the current compare cycle, and the second pair of match lines indicates the match results for the preceding compare cycle.

In one embodiment, the component multiplexers 769$_1$–769$_N$ within the first stage multiplexer 768 respond to a multi-bit select signal (not shown in FIG. 22) by outputting a selected one of the four input match signals as a respective one of first stage match signals 771$_1$–771$_N$ (only the first eight of which are shown). Thus, each first stage match signal 771 indicates the state of a selected one of the four match lines (i.e., selected by the multi-bit select signal) for the corresponding row. The first stage match signals 771$_1$–771$_N$ are provided to respective first inputs (i.e., '0' inputs) of component multiplexers 781$_1$–781$_N$ of multiplexer 780. In an embodiment in which only one pair of the four match lines is coupled to the corresponding CAM array (the other pair being used to store match results from the preceding compare cycle), the component multiplexers 781 may be two-input multiplexers that operate as described in reference to FIG. 21.

Match signals from the row match lines, R1ML$_{1-4}$–RNML$_{1-4}$, are also input in respective pairs to logic AND gates 773$_1$–773$_{N/2}$ (only the first four of which are shown in FIG. 22) within logic circuit 774 which, in turn, generate first stage composite match signals 775$_1$–775$_{N/2}$. For example, a match signal from the first match line of the first CAM row (i.e., R1ML$_1$) and a match signal from the second match line of the second CAM row (i.e., R2ML$_2$) are provided to AND gate 773$_1$ to generate first stage composite match signal 775$_1$. A match signal from the third match line of the third CAM row (R3ML$_3$) and a match signal from the fourth match line of the fourth CAM row (R4ML$_4$) are provided to AND gate 773$_2$ to generate first stage composite match signal 775$_2$. Similarly, match signals from the first and second match lines of CAM rows five and six (i.e., R5ML$_1$ and R6ML$_2$), respectively, are provided to AND gate 773$_3$, and match signals from third and fourth match lines of CAM rows seven and eight (R7ML$_3$ and R8ML$_4$), respectively, are provided to AND gate 7734. Match lines coupled to other rows of CAM cells, not shown, are similarly coupled in pairs to respective AND gates 773. The first stage composite match signals 775 are provided to respective second inputs (i.e., '1' inputs) of component multiplexers 781. Because there are half as many first stage composite match signals 775 as first stage match signals 771, only half the component multiplexers 781 (i.e., every other one) are coupled to receive first stage composite match signals 775, with the connections made on boundaries of lowest numbered CAM rows (other CAM row boundaries may be used in alternative embodiments). Component multiplexers 781 not coupled to receive a first stage composite match signal 775 are grounded at the second input, or otherwise configured to prevent match indication. For example, first stage composite match signals 775$_1$, 775$_2$, ..., 775$_{N/2}$ are provided to the second inputs of component multiplexers 781$_1$, 781$_3$, ..., 781$_{N-1}$, while the second inputs of component multiplexers 781$_2$, 781$_4$, ..., 781$_N$ are grounded.

The first stage composite match signals 775$_1$–775$_N$ are provided in respective pairs to logic AND gates 777$_1$–777$_{N/4}$ (only the first two of which are shown in FIG. 22) within logic circuit 776 which, in turn, generates second stage composite match signals $779_1$–$779_{N/4}$. For example, first stage composite match signals $775_1$ and $775_2$ are input to AND gate $777_1$ to generate second stage composite match signal $779_1$; first stage composite match signals $775_3$ and $775_4$ are input to AND gate $777_2$ to generate second stage composite match signal $779_2$; and so forth. The second stage composite match signals 779 are provided to respective third inputs (i.e., '2' inputs) of component multiplexers $781_1$–$781_N$. Because there are one-fourth as many second stage composite match signals 779 as first stage match signals 771, only one-fourth of the component multiplexers 781 (i.e., every fourth one) are coupled to receive second stage composite match signals 779, with the connections made on boundaries of lowest numbered CAM rows. Component multiplexers 781 not coupled to receive a second stage composite match signal 779 are grounded at the third input, or otherwise configured to prevent match indication. For example, composite match signals $779_1$, $779_2$, ..., $779_{N/4}$ are provided to the third inputs of component multiplexers $781_1$, $781_5$, ..., $781_{N-3}$, while the third inputs of component multiplexers $781_2$–$781_4$, $781_6$–$781_8$, ..., $781_{N-2}$–$781_N$ are grounded.

Each of the component multiplexers 781 includes a select input (not shown in FIG. 22) coupled to receive a word-select signal 782. The word-select signal 782 is a multi-bit signal having at least as many bits as necessary to enable selection of the different stages of match signals to be output from the multiplexer 780 to the priority encoder 306 as final match signals $783_1$–$783_N$. In one embodiment, for example, the word-select signal 782 is an encoded, two-bit signal in which states '00', '01' and ''10' are used to select the first stage match signals $771_1$–$771_N$, first stage composite match signals $775_1$–$775_{N/2}$, and second stage composite match signals $779_1$–$779_{N/4}$, respectively, to be output to the priority encoder 306. Thus, when the word-select signal 782 is set to the '00' state, first stage match signals $771_1$–$771_N$ are output as final match signals $783_1$–$783_N$ to corresponding priority encoder inputs PE1–PE(N). When the word-select signal 782 is set to the '01' state, first stage composite match signals $775_1$–$775_{N/2}$ are output as final match signals $783_1$, $783_3$, $783_5$, ..., $783_{N-1}$ to corresponding priority encoder inputs PE1, PE3, PE5, ..., PE(N-1), and the unused final match signals $783_2$, $783_4$, $783_6$, ..., $783_N$ are forced to a non-match state (e.g., grounded). Similarly, when the word-select signal 782 is set to the '10' state, second stage composite match signals $779_1$–$779_{N/4}$ are output as final match signals $783_1$, $783_5$, ..., $783_{N-3}$ to corresponding priority encoder inputs PE1, PE5, ..., PE(N-3), and the unused final match signals $783_2$–$783_4$, $783_6$–$783_8$, ..., $783_{N-2}$–$783_N$ are forced to a non-match state. In an alternative embodiment, different encodings of the word-select signal 782 may be used to select the different stages of match signals. Also, rather than being encoded, the word-select signal 782 may include as many constituent bits as match signal stages, with a given bit being active (i.e., high or low) at a time to select the corresponding stage of match signals.

In alternative embodiments, the match circuitry 765 may be extended to have any number of composite match signal stages by adding additional logic circuits and multiplexer inputs. For example a third stage of composite match signals may be generated by combining pairs of second stage match signals (e.g., pairs $779_1$/$779_2$, $779_3$/$779_4$, etc.) within a logic circuit similar to logic circuit 776, then outputting the third-stage of composite match signals to a fourth input (not shown in FIG. 22) of every eighth component multiplexer 781 within multiplexer 780 (the fourth inputs of the other seven component multiplexers per set of eight being grounded or otherwise configured to prevent match indication). The number of constituent bits within the word-select signal 782 may be increased as necessary to enable selection of any additional stages of composite match signals. Also, additional compare circuits and compare ports may be added within the CAM array to enable generation of more component match signals used to feed the additional logic circuits and multiplexer inputs. Alternatively, additional component match signals may be generated in a sequence of compare cycles, with the results of one or more preceding compare cycles being stored for availability during the final compare cycle in the sequence. Further, any combination of additional compare circuits, compare ports and storage circuits may be used to provide the component match signals needed for multi-word compare operations.

The section headings provided in this detailed description are for convenience of reference only, and in no way define, limit, construe or describe the scope or extent of such sections. Also, while the invention has been described with reference to specific embodiments thereof, it will be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) device comprising:
   first and second rows of CAM cells;
   a first pair of match lines coupled to the first row of CAM cells;
   a second pair of match lines coupled to the second row of CAM cells; and
   a first logic circuit coupled to a first match line of the first pair of match lines and to a first match line of the second pair of match lines, the first logic circuit being configured to output a match signal in a first state if both the first match lines indicate a match condition, and to output the match signal in a second state if either of the first match lines indicates a mismatch condition.

2. The CAM device of claim 1 further comprising:
   a first priority encoder coupled to the first match line of the first pair of match lines and to the second match line of the second pair of match lines; and
   a second priority encoder coupled to the second match line of the first pair of match lines and to the first match line of the second pair of match lines.

3. The CAM device of claim 2 wherein the first priority encoder is also coupled to receive the match signal output from the first logic circuit.

4. The CAM device of claim 1 further comprising a select circuit to output either a match signal present on the first match line of the first pair of match lines or the match signal output from the first logic circuit, depending on the state of a first select signal.

5. The CAM device of claim 4 further comprising:
   an interface to receive an instruction; and
   an control circuit coupled to receive the instruction from the interface and configured to output the first select signal in either a first logic state or a second logic state according to the instruction.

6. The CAM device of claim 5 wherein the control circuit is configured to generate the first select signal in a first state if the instruction indicates a single-word compare operation and in a second state if the compare instruction indicates a multiple-word comparand compare operation.

7. The CAM device of claim 4 further comprising a configuration circuit to store a mode value and configured to output the first select signal in either a first logic state or a second logic state according to the mode value.

8. The CAM device of claim 1 wherein each of the CAM cells within the first row of CAM cells comprises:
   a storage circuit; and
   first and second compare circuits coupled to the storage circuit.

9. The CAM device of claim 8 wherein the first match line of the first pair of match lines is coupled to the first compare circuit of each of the CAM cells within the first row of CAM cells, and wherein the second match line of the first pair of match lines is coupled to the second compare circuit of each of the CAM cells within the first row of CAM cells.

10. The CAM device of claim 1 further comprising a second logic circuit coupled to the second match line of the first pair of match lines and to the second match line of the second pair of match lines, the second logic circuit being configured to output a match signal in the first state if both the second match lines indicate a match condition, and to output the match signal in the second state if either of the second match lines indicates a mismatch condition.

11. The CAM device of claim 10 further comprising a select circuit coupled to receive the match signal generated by the first logic circuit and the match signal generated by the second logic circuit, the select circuit being responsive to a select signal to output either the match signal generated by the first logic circuit or the match signal generated by the second logic circuit.

12. The CAM device of claim 11 further comprising a configuration circuit to store a mode value and to output the select signal in either a first logic state or a second logic state according to the mode value.

13. The CAM device of claim 11 further comprising:
   an interface to receive a compare instruction; and
   a control circuit coupled to receive the instruction from the interface and configured to output the select signal in either a first logic state or a second logic state according to the compare instruction.

14. The CAM device of claim 1 further comprising a storage circuit coupled to the first match line of the first pair of match lines to store a match value indicative of the state of the first match line of the first pair of match lines.

15. The CAM device of claim 14 further comprising a logic AND gate coupled to receive the match value from the storage circuit and coupled to the first match line of the second pair of match lines.

16. The CAM device of claim 1 wherein the first logic circuit comprises an AND gate having a first input coupled to the first match line of the first pair of match lines and a second input coupled to the first match line of the second pair of match lines.

17. The CAM device of claim 16 further comprising storage circuits coupled to the first match lines to store the states of respective match signals thereon and to output the stored states of the respective match signals to the first and second inputs of the AND gate.

18. The CAM device of claim 1 further comprising:
   a first pair of precharge circuits coupled respectively to the first match lines of the first pair of match lines and to the second match line of the second pairs of match lines; and
   a second pair of precharge circuits coupled respectively to the second match lines of the first of match lines and to the first match line of the second pairs of match lines.

19. The CAM device of claim 18 further comprising circuitry to assert a first precharge enable signal to enable the first pair of precharge circuits to precharge the first match line of the first pair of match lines and the second match line of the second pair of match lines during a first interval, and to assert a second precharge enable signal to enable the second pair of precharge circuits to precharge the second match lines of the first pair of match lines and the first match line of the second pair of match lines during a second interval.

20. The CAM device of claim 19 wherein the CAM device further comprises control circuitry to initiate a first compare operation in the first and second rows of CAM cells during the first interval and to initiate a second compare operation in the first operation producing match results on the second pair of match lines and the second compare operation producing match results on the first pair of match lines.

21. A content addressable memory (CAM) device comprising:
   a plurality of row pairs of CAM cells, wherein each row of CAM cells in a row pair is coupled to a plurality of match lines; and
   a plurality of logic circuits each having inputs coupled to the plurality of match lines of a corresponding row pair of CAM cells, each of the plurality of logic circuits configured to selectively combine match results on the plurality of match lines of both rows of a corresponding row pair and output a composite match signal.

22. The CAM device of claim 21 wherein each CAM cell within each row of CAM cells in a row pair includes a plurality of compare circuits coupled respectively to the plurality of match lines.

23. The CAM device of claim 22 wherein each CAM cell within each row of CAM cells in a row pair includes a memory cell coupled to each of the plurality of compare circuits within the CAM cell.

24. The CAM device of claim 21 wherein each of the plurality of logic circuits comprises a logic AND gate to logically AND the match results on a respective pair of match lines of the plurality of match lines.

25. A content addressable memory (CAM) device comprising:
   a plurality of CAM cells each including a first compare circuit and a second compare circuit;
   a plurality of first match lines coupled to the first compare circuits included in the plurality of CAM cells;
   a plurality of second match lines coupled to the second compare circuits included in the plurality of CAM cells; and
   a plurality of logic circuits each coupled to a respective one of the first match lines and a respective one of the second match lines, each logic circuit being configured to output a match signal having a state according to the state of the one of the first match lines and the state of the one of the second match lines.

26. The CAM device of claim 25 wherein each of the plurality of logic circuits is configured to output a match signal in a first state if the one of the first match lines indicates a match and the one of the second match lines indicates a match, each of the plurality of logic circuits being further configured to output a match signal having a second state if either of the one of the first match lines and the one of the second match lines indicates a mismatch.

27. The CAM device of claim 26 wherein each of the plurality of logic circuits comprises a logic AND gate having a first input coupled to the one of the first match lines and a second input coupled to the one of the second match lines.

28. The CAM device of claim 27 wherein each of the plurality of logic circuits further comprises a select circuit having a first input coupled to an output of the logic AND gate and a second input coupled to the one of the first match lines.

29. The CAM device of claim 28 wherein the select circuit is a multiplexer.

30. The CAM device of claim 25 further comprising a priority encoder coupled to receive the match signals output by the plurality of logic circuits.

31. A method of operation within a content addressable memory (CAM) device, the method comprising:
   simultaneously performing first and second compare operations in an array of CAM cells to generate first and second sets of match signals; and
   logically combining the first set of match signals with the second set of match signals to generate a set of resultant match signals.

32. The method of claim 31 wherein simultaneously performing first and second compare operations in an array of CAM cells comprises simultaneously providing first and second comparands to the array of CAM cells via first and second compare ports, respectively.

33. The method of claim 32 wherein the CAM cells in the array of CAM cells are arranged in rows, each row of CAM cells being coupled to a corresponding pair of match lines, and wherein simultaneously performing first and second compare operations in the array of CAM cells further comprises receiving the first and second comparands in each of the rows of CAM cells, each row of CAM cells outputting a first match signal on a first match line of the corresponding pair of match lines according to whether the first comparand matches a value stored within the row of CAM cells, and each row of CAM cells outputting a second match signal on a second match line of the corresponding pair of match lines according to whether the second comparand matches the value stored within the row of CAM cells.

34. The method of claim 31 wherein simultaneously performing first and second compare operations comprises simultaneously comparing a value stored within each CAM cell of the CAM array with a portion of a first comparand value and a portion of a second comparand value.

35. The method of claim 31 wherein logically combining the first set of match signals with the second set of match signals comprises combining each match signal of the first set of match signals with a respective match signal of the second set of match signals to generate a respective one of the resultant match signals.

36. The method of claim 35 wherein combining each match signal of the first set of match signals with a respective match signal of the second set of match signals comprises logically ANDing each match signal of the first set of match signals with the respective match signal of the second set of match signals to generate the respective one of the resultant match signals.

37. The method of claim 31 further comprising selecting either the set of resultant match signals or the first set of match signals to be output as a selected set of match signals.

38. The method of claim 37 further comprising generating a match address based on the selected set of match signals.

39. A content addressable memory (CAM) device comprising:
   an array of CAM cells;
   means for simultaneously performing first and second compare operations in the array of CAM cells to generate first and second sets of match signals; and
   means for logically combining the first set of match signals with the second set of match signals to generate a set of resultant match signals.

40. The CAM device of claim 39 wherein the means for simultaneously performing first and second compare operations in the array of CAM cells comprises means for simultaneously providing first and second comparands to the array of CAM cells via first and second compare ports, respectively.

41. The CAM device of claim 39 wherein the means for simultaneously performing first and second compare operations comprises means for simultaneously comparing a value stored within each CAM cell of the CAM array with a portion of a first comparand value and a portion of a second comparand value.

42. The CAM device of claim 39 wherein the means for logically combining the first set of match signals with the second set of match signals comprises means for combining each match signal of the first set of match signals with a respective match signal of the second set of match signals to generate a respective one of the resultant match signals.

43. The CAM device of claim 39 further comprising means for selecting either the set of resultant match signals or the first set of match signals to be output as a selected set of match signals.

44. The CAM device of claim 43 further comprising means for generating a match address based on the selected set of match signals.

* * * * *

UNITED STATES PATENT AND TRADEMARK OFFICE
CERTIFICATE OF CORRECTION

PATENT NO.        : 6,901,000 B1
APPLICATION NO. : 10/622862
DATED             : May 31, 2005
INVENTOR(S)       : Michael E. Ichiriu et al.

It is certified that error appears in the above-identified patent and that said Letters Patent is hereby corrected as shown below:

Item (73) on Title page should read: --Assignee: NetLogic Microsystems, Inc., Mountain View, CA (US)--

Signed and Sealed this

Eighteenth Day of September, 2007

JON W. DUDAS
*Director of the United States Patent and Trademark Office*